(12) United States Patent
Matsubara et al.

(10) Patent No.: US 7,785,986 B2
(45) Date of Patent: Aug. 31, 2010

(54) METHOD OF MANUFACTURING SEMICONDUCTOR DEVICE

(75) Inventors: Yoshihisa Matsubara, Sagamihara (JP);
Hiromichi Suzuki, Katsushika (JP);
Wahei Kitamura, Nakano (JP); Kosho Akiyama, Nishitokyo (JP); Seiji Kato, Chiba (JP)

(73) Assignee: Renesas Electronics Corp., Tokyo (JP)

( * ) Notice: Subject to any disclaimer, the term of this patent is extended or adjusted under 35 U.S.C. 154(b) by 0 days.

(21) Appl. No.: 12/400,892

(22) Filed: Mar. 10, 2009

(65) Prior Publication Data
US 2009/0176333 A1      Jul. 9, 2009

Related U.S. Application Data

(62) Division of application No. 11/007,185, filed on Dec. 9, 2004, now Pat. No. 7,504,315.

(30) Foreign Application Priority Data

Dec. 9, 2003  (JP) ............................. 2003-409718
Apr. 28, 2004 (JP) ............................. 2004-132336

(51) Int. Cl.
    *H01L 21/30*   (2006.01)
    *H01L 23/34*   (2006.01)
(52) U.S. Cl. ...................................... 438/455; 257/724
(58) Field of Classification Search ......... 438/107–110, 438/67, 455; 257/723–727, E23.001–E23.194
    See application file for complete search history.

(56) References Cited

U.S. PATENT DOCUMENTS 7,059,476 B2 * 6/2006 Kunii et al. ................. 206/725
7,504,315 B2 * 3/2009 Matsubara et al. .......... 438/455

FOREIGN PATENT DOCUMENTS

JP  2002-002871   1/2002
JP  2002-110778   4/2002

* cited by examiner

*Primary Examiner*—Calvin Lee
(74) *Attorney, Agent, or Firm*—Antonelli, Terry, Stout & Kraus, LLP.

(57) ABSTRACT

To prevent semiconductor chips from adhering to the trays during transport, a method is employed which transports semiconductor chips in the following state. When trays provided with a plurality of accommodating portions having a recessed cross section for accommodating semiconductor chips on a main surface thereof are stacked in a plurality of stages, the semiconductor chips are accommodated in spaces defined by the accommodating portions formed over the main surface of the lower-stage tray and corresponding accommodating portions formed over the back surface of the upper-stage tray. Here, on bottom surfaces of the accommodating portions formed over the back surface of the upper-stage tray, isolated projections having a height which prevents the projections from coming into contact with the semiconductor chips are arranged in a scattered manner. In this way, it is possible to prevent the semiconductor chips from adhering to the back surface of the upper-stage tray.

15 Claims, 31 Drawing Sheets

METHOD OF MANUFACTURING SEMICONDUCTOR DEVICE

CROSS-REFERENCE TO RELATED APPLICATION

The present application claims priority from Japanese patent application No 2004-132336, filed on Apr. 28, 2004, and Japanese patent application No. 2003-409718, filed on Dec. 9, 2003, the contents of which are hereby incorporated by reference into this application. This application is a Divisional application of application Ser. No. 11/007,185, filed Dec. 9, 2004 now U.S. Pat. No. 7,504,315, the contents of which are incorporated herein by reference in their entirety.

BACKGROUND OF THE INVENTION

The present invention relates in general to a method of transporting a semiconductor device, during the manufacture of the a semiconductor device, and, more particularly, the invention relates to a technique for transporting a semiconductor device using a tray.

In the manufacture or shipping of a semiconductor device, as a method of transporting semiconductor chips (including a CSP (Chip Size Package), which have been cut out from a semiconductor wafer, to a given site, a method has been employed in which a plurality of semiconductor chips are transported in a state wherein the semiconductor chips are carried in a plate-like container, which is commonly referred to as a "tray".

In transporting the semiconductor chips, a plurality of trays having the same constitution are stacked in multiple stages to form a set, and several sets of the trays of semiconductor chips are accommodated in an exclusive-use vinyl bag and are conveyed in that state. On a main surface and a back surface of each tray, a plurality of accommodating portions having a recessed cross section for accommodating the semiconductor chips are formed. By stacking the trays, spaces are formed where the accommodating portions formed over the main surface of the lower-stage tray and the accommodating portions formed over the back surface of the upper-stage (lid side) tray are overlap each other, and the semiconductor chips can be accommodated in these spaces.

However, in the above-mentioned method of transporting semiconductor chips using trays, there exists a drawback in that the semiconductor chip tends to adhere to the back surface of the upper-stage tray due to the action of static electricity at the time of transporting the semiconductor chips. Once a semiconductor chip adheres to the back surface of the upper-stage tray, when the upper-stage tray is removed to take out the semiconductor chips from the tray or to inspect the appearance or the like of the semiconductor chips, the semiconductor chip which has adhered to the upper-stage tray is not present in the accommodating portion of the lower-stage tray where the semiconductor chip should be accommodated, thus giving rise to a drawback in that the semiconductor chip cannot be taken out or cannot be inspected. Accordingly, as a countermeasure to prevent the adhesion of a semiconductor chip to an upper-stage tray, a dull (rough surface) finish treatment is applied to the accommodating portions of the back surface of the upper-stage tray.

A method of transporting semiconductor chips using trays is described in Japanese Unexamined Patent Publication 2002-110778 (patent literature 1), for example. This patent literature 1 discloses a technique in which, to prevent the semiconductor chips from being scattered or damaged during transportation, projections are formed over a lid-side tray, and the semiconductor chips are transported in a state in which the semiconductor chips are pushed by these projections.

Further, Japanese Unexamined Patent Publication 2002-2871 (patent literature 2), for example, discloses a constitution in which, to prevent CSPs on which bump electrodes are formed from being broken or ruptured during the transportation thereof, buffer portions, which are formed of a material softer than a tray, are formed over CSP accommodating portions of the tray. This patent literature 2 also discloses a constitution in which projections are formed over a surface side of the buffer portion which faces the CSP, and the CSP is supported by these projections.

SUMMARY OF THE INVENTION

However, the inventors of the present invention have found that the technique in which a dull (rough surface) finish treatment is applied to the accommodating portions formed over the back surface of the upper-stage tray has the following drawbacks.

That is, along with the trend by which semiconductor chips are becoming light-weight due to a reduction of the thickness of the semiconductor chips, and, at the same time, due to the adhesiveness of a resin film, such as a polyimide film or the like, when the resin film is exposed on a main surface (a die forming surface) of the semiconductor chip, the semiconductor chip is liable to easily adhere to a back surface of an upper-stage tray during handling of the tray. Accordingly, there arises a drawback in that, even when a dull finish treatment is applied to the accommodating portions formed over the back surface of the upper-stage tray, it is impossible to prevent the occurrence of the semiconductor chip adhesion phenomenon.

Accordingly, it is an object of the present invention to provide a technique which prevents semiconductor chips from adhering to a tray.

The above-mentioned and other objects and novel features of the present invention will become more apparent in conjunction with the description thereof in this specification and the attached drawings.

A summary of representative aspects and features of the invention disclosed in this specification is as follows.

That is, according to the present invention, when a plurality of trays are stacked in multiple stages, projections having a height which is insufficient to bring the projections into contact with semiconductor chips are arranged in a scattered manner in accommodating portions which are formed over a back surface of an upper-stage tray and which face the main surfaces of the semiconductor chips accommodated in a lower-stage tray that are arranged in an opposed manner.

Further, the present invention includes a step of transporting semiconductor chips using trays, wherein a plurality of first projecting portions which are formed over a main surface of the tray for forming first accommodating portions which accommodate the semiconductor chips and a plurality of second projecting portions which are formed over a back surface of the tray for forming second accommodating portions which accommodate the semiconductor chips are arranged to be engaged in a fitting manner with each other when the trays are overlapped in a plurality of stages.

A brief explanation of the advantageous effects obtained by the invention disclosed in this specification is as follows.

That is, in stacking a plurality of trays in multiple stages, projections having a height which is insufficient to bring the projections into contact with semiconductor chips are arranged in a scattered manner in the accommodating portions which are formed over the back surface of an upper-stage tray, which the main surfaces of the semiconductor chips accommodated in a lower-stage tray face in an opposed manner, and, hence, it is possible to prevent the semiconductor chips from adhering to the tray.

DETAILED DESCRIPTION OF THE PREFERRED EMBODIMENTS

In the embodiments described hereinafter, when it is necessary for the sake of convenience, the subject matter of the invention may be divided into a plurality of sections or a plurality of embodiments. However, unless otherwise specified particularly, these embodiments are not irrelevant to each other, and there exists a relationship such that one embodiment is a modification, a detailed explanation or a complementary explanation of a portion or the whole of other embodiments.

Further, in the description of the embodiments hereinafter, when the reference is made to a specific number and the like (including number, numerical values, quantity, range and the like) of elements, unless otherwise specified and unless it is otherwise obvious that the number and the like of elements are definitely limited to the specific number in principle, the number and the like are not limited to such specific number and may be a number above or below the specific number.

Further, in the description of the embodiments hereinafter, it is needless to say that all of the constituent elements (including element steps and the like) are not always indispensable unless otherwise specified or unless they are considered indefinitely indispensable in principle.

In the same manner, in the description of the embodiments hereinafter, when reference is made to a shape, positional relationship and the like of constituent elements, unless otherwise specified or unless it is definitely considered unreasonable in view of the principle involved, these shapes and positional relationships substantially include those which approximate or are similar to these shapes. The same goes for the above-mentioned numerical values and ranges.

Further, in all of the drawings, constitutional elements which have the same functions are identified by the same symbols and a repeated explanation thereof is omitted. Hereinafter, various embodiments of the present invention will be explained in detail in conjunction with the drawings.

Embodiment 1

Figure 1:
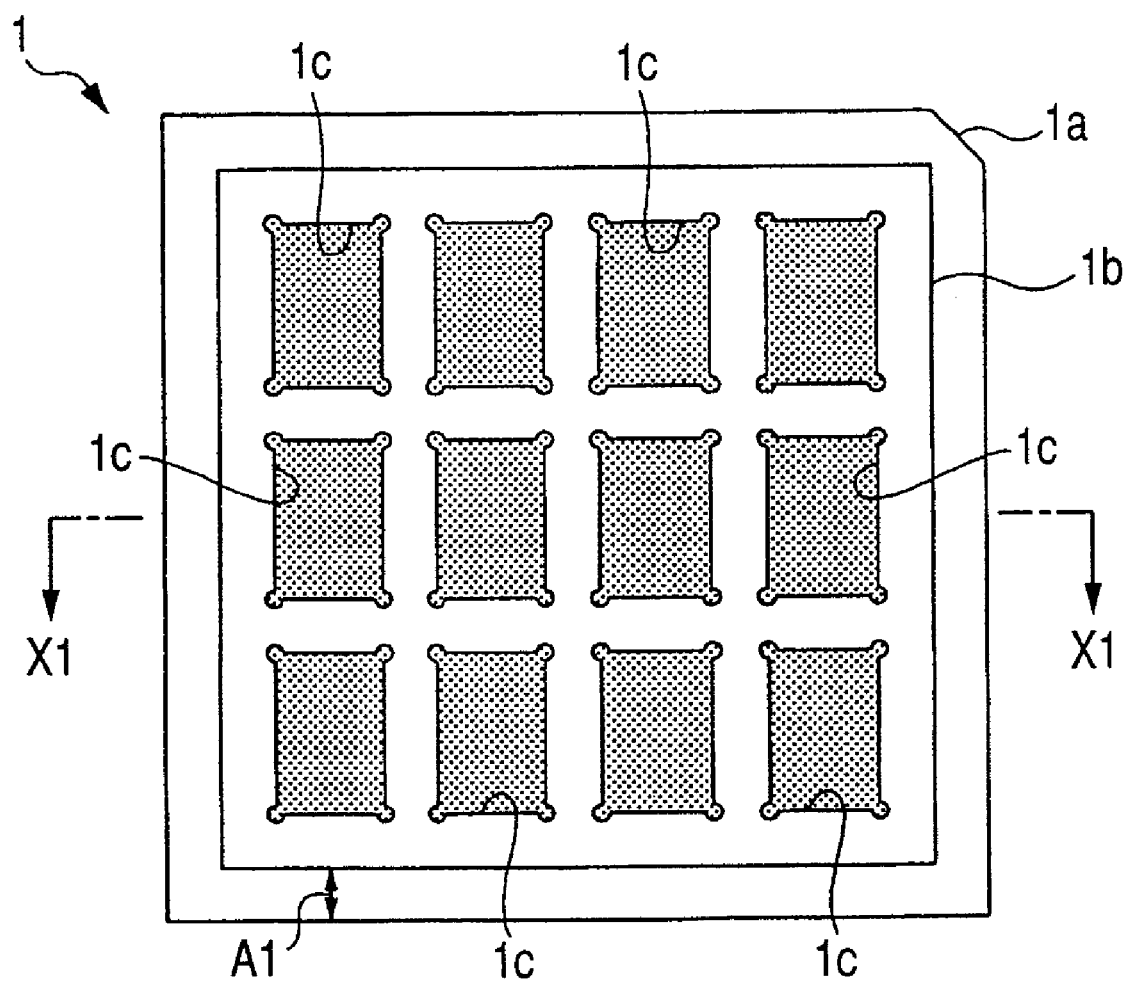
FIG. 1 is an overall plan view of a main surface of a tray used in a method of transporting a semiconductor device according to one embodiment of the present invention.
Figure 2:
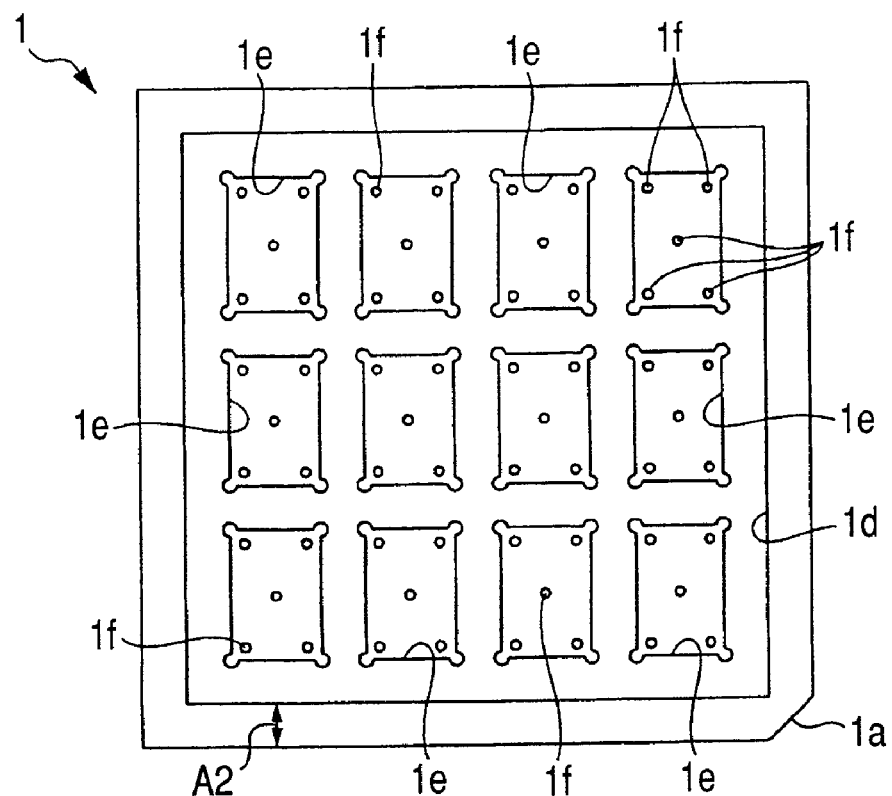
FIG. 2 is an overall plan view of a back surface of the tray shown in FIG. 1.
Figure 3:
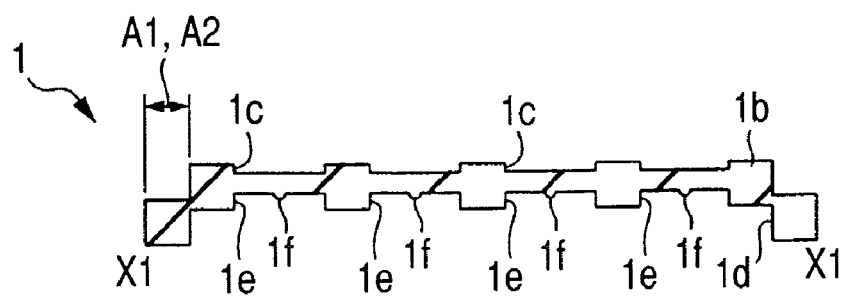
FIG. 3 is a cross-sectional view taken along a line X1-X1 in FIG. 1.

An example of a tray used in a method of transporting a semiconductor device according to an embodiment 1 is shown in FIG. 1 to FIG. 3. Here, the term transport includes the transport of items for various purposes, such as transport between steps, transport for shipping and the like.

The tray 1 of this embodiment 1 is a container which is used for transporting semiconductor chips (CSP (Chip Size Package)), for example. The appearance of the tray 1 is configured to have a thin planar approximately square shape, with a chamfered portion 1a for indexing formed in one corner portion thereof, for example. The profile size is set such that the longitudinal size is approximately 50 mm, the lateral width is approximately 50 mm and the height is approximately 4 mm.

The tray 1 is, for example, made of an insulation material, such as AAS (acrylonitrile-acrylate-styrene) resin, ABS (acrylonitrile-butadiene-styrene) resin or PS (polystyrene) resin. From the viewpoint of suppressing or preventing electrostatic breakdown of the semiconductor chips by lowering the charging of chips with static electricity, the constitutional material of the tray 1 contains a hydrophilic polymer, for example. As a measure to cope with electrostatic breakdown, the addition of carbon into the material of the tray 1 and the formation of conductive patterning on the tray 1 may be considered. However, the addition of a hydrophilic polymer can reduce the generation of foreign substances compared to the addition of carbon, and, at the same time, a method for forming a constitutional material containing a hydrophilic polymer is easier compared to a method for forming a conductive pattern on the tray 1, whereby the manufacturing cost of the tray 1 can be reduced.

On a region inside an outer periphery of a main surface of the tray 1 by a distance A1, a projecting portion 1b is formed, which projects in a direction perpendicular to the main surface of the tray 1. The distance A1 is 2 to 2.5 mm, for example. On a main surface of the projecting portion 1b, a plurality of accommodating portions (first accommodating portions) 1c, which are recessed in the direction perpendicular to the main surface, are arranged in a matrix array. The accommodating portions 1c are regions for accommodating the semiconductor chips. Although the number of accommodating portions 1c is not specifically limited, in this embodiment, a case will be considered in which twelve (=3×4) accommodating portions 1c are provided. Each accommodating portion 1c is formed to have a planar approximately rectangular shape, for example, wherein the planar size is approximately 12 mm×9 mm, for example. The bottom surface of each accommodating portion 1c constitutes a surface with which a back surface (a surface on which a semiconductor die and lines are not formed) of the semiconductor chip is brought into contact, and a dull (rough surface) finish treatment is applied to this bottom surface. That is, the bottom surface of the accommodating portion 1c is formed in a state in which minute surface irregularities are formed densely over the entire surface, thus exhibiting a non-luster condition. Here, although FIG. 1 is a plan view, to reflect the above-mentioned condition, hatching in a crepe pattern is formed over the bottom surfaces of the accommodating portions 1c in FIG. 1.

On the other hand, on a region inside the outer periphery of a back surface of the tray 1 by a distance A2, a recessed portion 1d is formed, which is recessed in the direction perpendicular to the back surface of the tray 1, as seen in FIG. 2. The distance A2 is equal to the distance A1. That is, the recessed portion 1d is formed such that the above-mentioned projecting portion 1b can snugly fitted into the inside of the recessed portion 1d. On a bottom surface of the recessed portion 1d, a plurality of accommodating portions (second accommodating portions) 1e, which are recessed in the direction perpendicular to the main surface, are arranged in a matrix array. The accommodating portions 1e are regions for accommodating the semiconductor chips. The arrangement, the shape and the planar size of the accommodating portions 1e are set to be equal to the arrangement, the shape and the planar size of the accommodating portions 1c formed over the main surface of the projecting portion 1b. The bottom surface of each accommodating portion 1e is a surface with which a main surface (a surface on which the die and lines are formed) of the semiconductor chip in a lower tray faces or is brought into contact. On the bottom surface of the accommodating portion 1e, for example, five isolated semispherical fine projections 1f are arranged in a scattered manner. In this embodiment 1, by providing these projections 1f, it is possible to prevent the semiconductor chip in a lower tray from becoming adhered to the bottom surface of the accommodating portion 1e on the back surface side of the upper tray 1.

Figure 4:
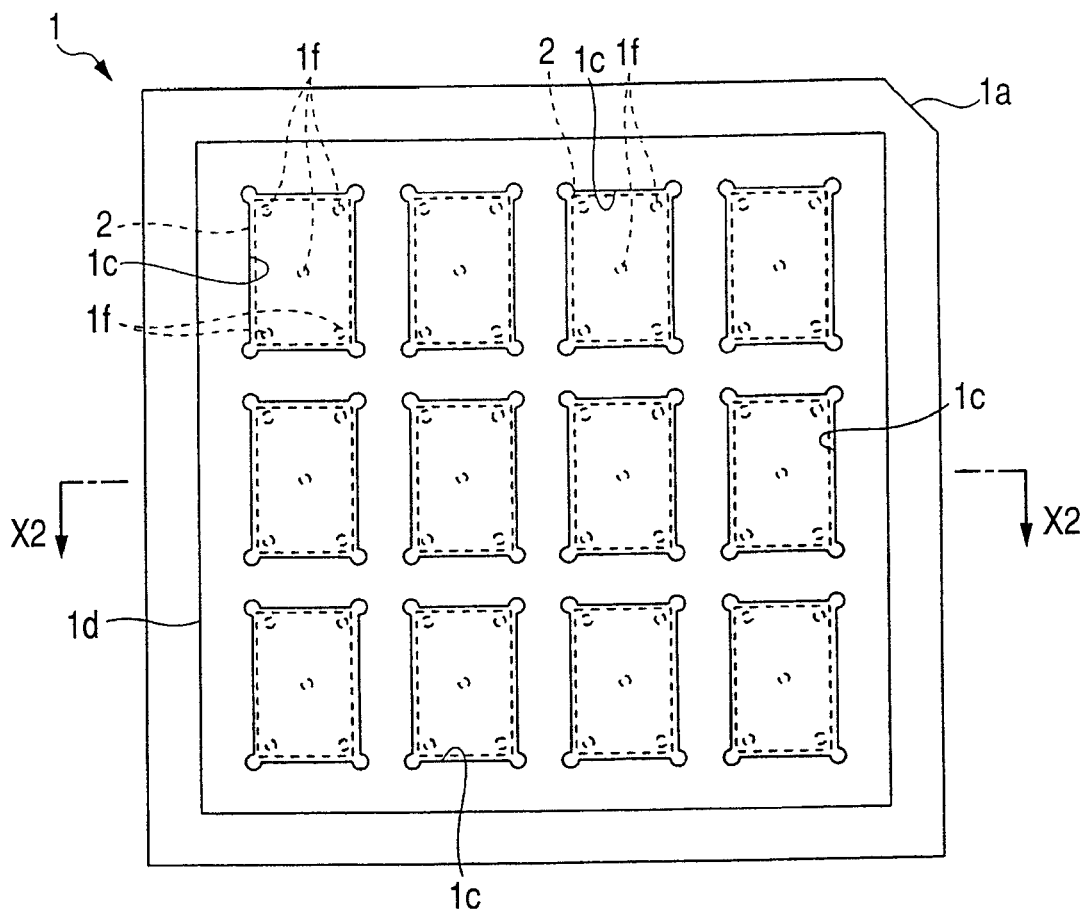
FIG. 4 is an overall plan view of the main surface of the tray when the trays shown in FIG. 1 are stacked in two stages.
Figure 5:
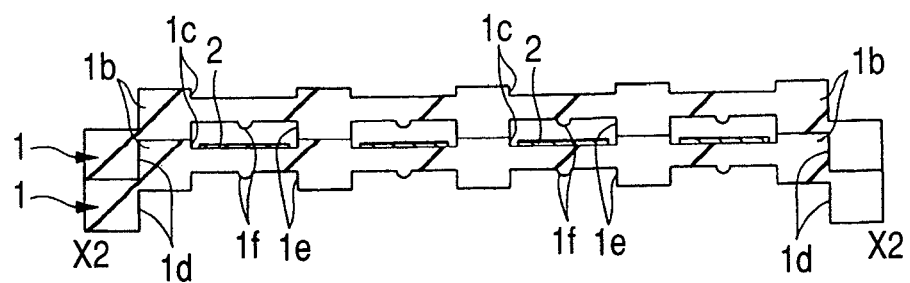
FIG. 5 is a cross-sectional view taken along a line X2-X2 in FIG. 4.
Figure 6:
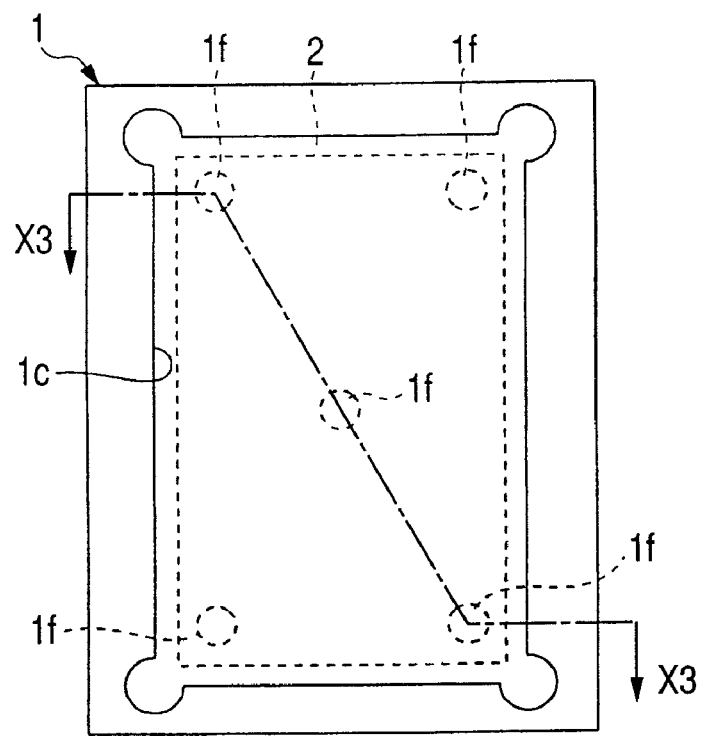
FIG. 6 is an enlarged plan view of an accommodating portion of the tray shown in FIG. 4 for holding one semiconductor chip.
Figure 7:
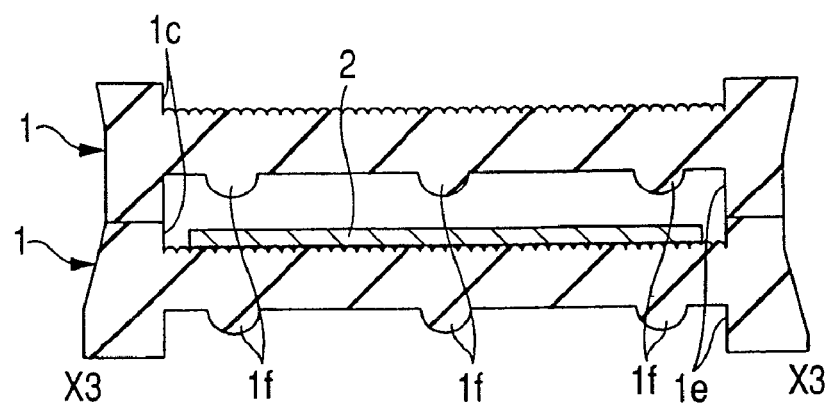
FIG. 7 is a cross-sectional view taken along a line X3-X3 in FIG. 6.
Figure 8:
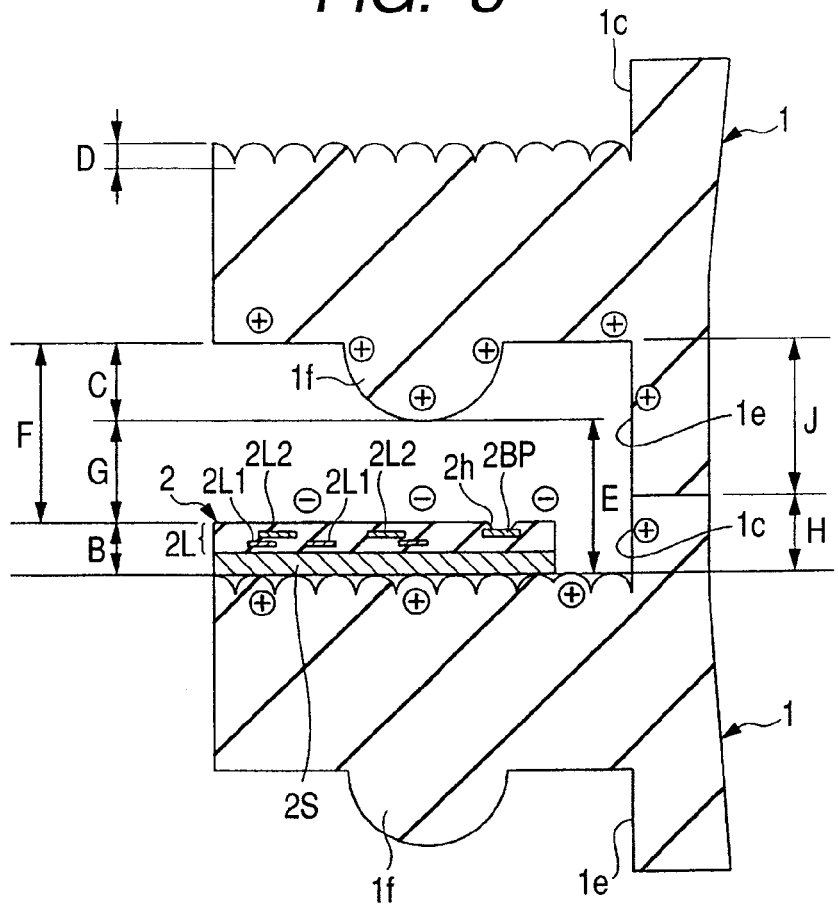
FIG. 8 is an enlarged cross-sectional view of a part of the tray shown in FIG. 7.
Figure 9:
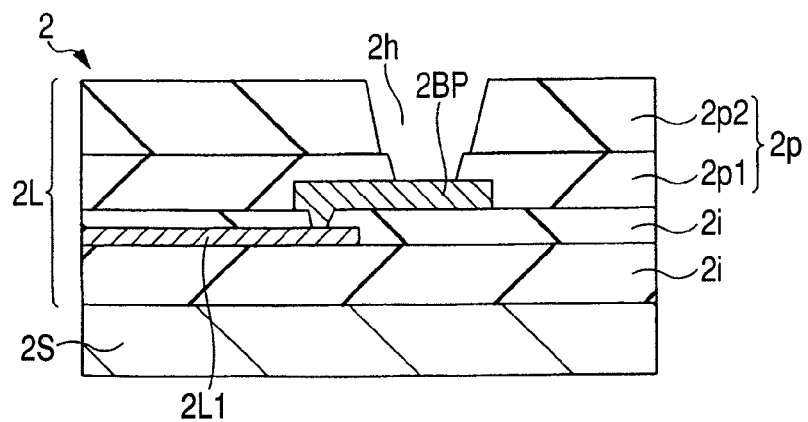
FIG. 9 is an enlarged cross-sectional view showing one example of the semiconductor chip in FIG. 4 to FIG. 8.
Figure 10:
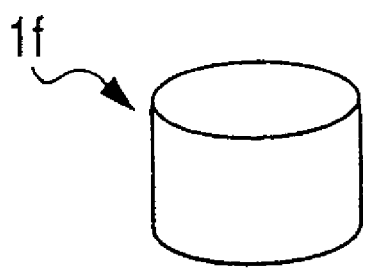
FIG. 10 is a perspective view of a modification of a profile of the projection formed over an accommodating portion of a back surface of the tray shown in FIG. 1.
Figure 11:
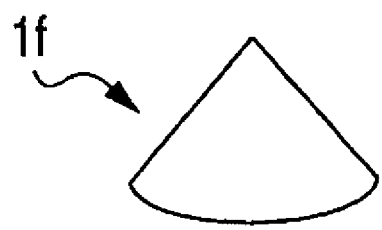
FIG. 11 is a perspective view of a modification of the profile of a projection formed over an accommodating portion of a back surface of the tray shown in FIG. 1.
Figure 12:
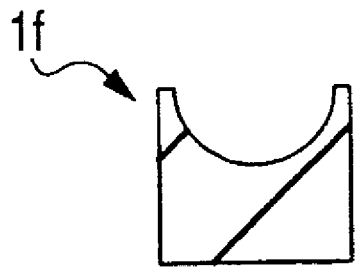
FIG. 12 is a cross-sectional view of a modification of the profile of a projection formed over an accommodating portion of a back surface of the tray shown in FIG. 1.
Figure 13:
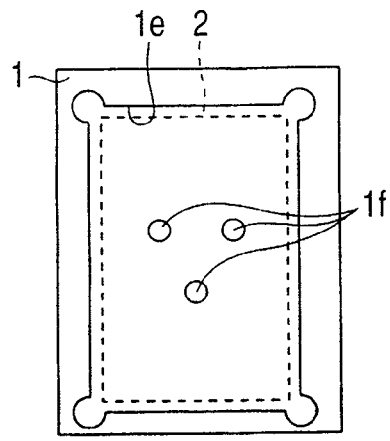
FIG. 13 is an enlarged plan view of a tray showing a modification of the number of projections formed over an accommodating portion of a back surface of the tray shown in FIG. 1.

Next, the feature of the invention which prevents the adhesion of the semiconductor chip will be explained in conjunction with FIG. 4 to FIG. 13. FIG. 4 is an overall plan view of the main surface of the tray 1 in an arrangement in which trays 1 are stacked in two stages. FIG. 5 is a cross-sectional view taken along a line X2-X2 in FIG. 4. FIG. 6 is an enlarged plan view of one of the accommodating portions 1c shown in FIG. 4. FIG. 7 is a cross-sectional view taken along a line X3-X3 in FIG. 6. FIG. 8 is an enlarged cross-sectional view of a part of the tray 1 in FIG. 7. FIG. 9 is an enlarged cross-sectional view of a part of one example of the semiconductor chip 2 shown in FIG. 4 to FIG. 8. FIG. 10 to FIG. 12 are views showing modifications of the profile of the projections 1f, wherein FIG. 10 and FIG. 11 are perspective views of the projections 1f and FIG. 12 is a cross-sectional view of the projection 1f. FIG. 13 is an enlarged plan view of part of the back surface of the tray 1 showing a modification of the arrangement and the number of the projections 1f. Here, in FIG. 4 and FIG. 6, for facilitating an the understanding of the drawings, the hatching in a crepe pattern is not applied to the drawings.

Here, a case illustrated in which two trays 1 are stacked in the thickness direction of the trays 1 in a stable manner, showing that, when the positions of the chamfered portions 1a for indexing of the respective trays 1 are aligned with each other, the recessed portion 1d formed in the back surface of the upper-stage tray 1 is fitted on the projecting portion 1b formed over the main surface of the lower-stage tray 1. Spaces are defined where the accommodating portions 1c formed over the main surface of the lower-stage tray 1 and the accommodating portions 1e formed over the back surface of the upper-stage tray 1 overlap relative to each other, and the semiconductor chips 2 are accommodated in these spaces. The semiconductor chips 2 are mounted such that the main surfaces (surfaces on which dies and lines are formed) of the semiconductor chips 2 are arranged to face the bottom surfaces (surfaces on which the projections 1f are formed) of the accommodating portions 1e formed over the back surface of the upper-stage tray 1, while the back surfaces (surfaces on which the dies and lines are not formed) of the semiconductor chips 2 are brought into contact with the bottom surfaces (surfaces to which the dull finish treatment is applied) of the accommodating portions 1c formed over the main surface of the lower-stage tray 1.

The semiconductor chip 2 is, when the semiconductor chip 2 is used for a product which is required to have an extremely small thickness, such as a memory chip of a memory card, subjected to a thickness reduction treatment. That is, by applying grinding treatment, polishing treatment, etching treatment or a composite treatment of these treatments to the back surface of the semiconductor chip 2, the thickness B of the semiconductor chip 2 (see FIG. 8) can be reduced to, for example, 150 µm or less, or 100 µm or less. Here, the thickness B is reduced to about 90 µm. A semiconductor board 2S which constitutes the semiconductor chip 2 (hereinafter simply referred to as a "board") is made of silicon (Si) single crystal, for example, and a die and a wiring layer 2L are formed over the main surface of the board. In the wiring layer 2L, lines 2L1, 2L2, bonding pads (external terminals) 2BP, an interlayer insulation film 2i and a protective film 2p are formed, as seen in FIG. 9. The protective film 2p includes a stacked film constituted of an insulation film 2p1, which covers an uppermost line 2L2 and the bonding pads 2BP, and an insulation film 2p2, which is stacked on the insulation film 2p1. The interlayer insulation film 2i and the insulation film 2p1 are formed of an inorganic insulation film made of, for example, silicon oxide ($SiO_2$ or the like) or the like. The insulation film 2p2 is formed in a state such that the insulation film 2p2 is exposed on an uppermost surface of the main surface of the semiconductor chip 2 and is formed of an organic insulation film, such as polyimide resin, for example. An opening portion 2h is formed in a portion of the insulation film 2p2, and a portion of the bonding pad 2BP is exposed from the opening portion 2h. Here, a bump electrode is not formed over the bonding pad 2BP. Further, the planar size of the semiconductor chip 2 is approximately 8 mm×11 mm, for example.

The projections 1f, which are formed over the accommodating portion 1e of the above-mentioned tray 1, are formed in such a way that the roughness of the bottom surface of the accommodating portion 1e is greater than the roughness of the bottom surface of the accommodating portion 1c. Further, the total area occupied by the projections 1f within the bottom surface of the accommodating portion 1e is set to be equal to or less than the total area of the region where the projections 1f are not formed within the bottom surface of the accommodating portion 1e, and the area is preferably less than the total area of the region where the projections 1f are not formed within the bottom surface of the accommodating portion 1e, or one half or less than one half of the total area of the bottom surface of the accommodating portion 1e. In this embodiment 1, since the diameter of the respective projections 1f is 0.6 mm, for example, the total area occupied by the projections 1f is 1.4 mm$^2$(=0.28×5), for example.

Further, the height C of the projections 1f (see FIG. 8) is greater than the size D of the raised portions of the fine irregularities formed by the dull finish treatment applied to the accommodating portion 1c of the main surface of the tray 1. That is, the height C of the projections 1f is approximately 40 µm at a minimum, and, preferably, is not less than 80 µm. However, if the projections 1f are allowed to come into contact with the main surface of the semiconductor chip 2 so as to push against the semiconductor chip 2 when the semiconductor chip 2 is accommodated in the tray 1, cracks may occur in the semiconductor chip 2. To prevent such a drawback, the projections 1f are formed with a height which prevents the distal ends of the projections 1f from being brought into contact with the main surface of the semiconductor chip 2, thus preventing the projections 1f from pushing against the semiconductor chip 2 when the semiconductor chip 2 is accommodated in the tray 1, as seen in FIG. 5, FIG. 7 and FIG. 8. That is, the distance E (see FIG. 8) from the back surface of the semiconductor chip 2 (bottom surface of the accommodating portion 1c) to the distal end of the projection 1f is set to be larger than the thickness B of the semiconductor chip 2. In view of the above-mentioned considerations, in this embodiment 1, the height C of the projections 1f is set to approximately 100 m, for example.

By forming the projections 1f on the accommodating portions 1e that are formed over the back surface of the tray 1, the influence attributed to static electricity on the semiconductor chip 2 from the back surface of the upper-stage tray 1 can be reduced. This is because the distance F from the main surface of the semiconductor chip 2 to the bottom surface of the accommodating portion 1e having no projections 1f (see FIG. 8) is longer than the distance G from the main surface of the semiconductor chip 2 to the distal end of the projection 1f. Thus, with respect to the facing surfaces formed by the main surface of the semiconductor chip 2 and the bottom surface of the accommodating portion 1e, it is possible to make the area of the facing surfaces with the distance F, which is the longer distance, larger than the area of the facing surfaces with the distance G, which is having the shorter distance. Particularly, in this embodiment 1, by making the total area occupied by the projections 1f within the bottom surface of the accommodating portion 1e smaller than the total area of the region where no projections 1f are formed within the bottom surface of the accommodating portion 1e, with respect to the facing surfaces formed by the main surface of the semiconductor chip 2 and the bottom surface of the accommodating portion 1e, it is possible to make the area of the facing surfaces with the distance F, which is having the longer distance, larger than the area of the facing surfaces with the distance G, which is the shorter distance.

Further, the main surface of the semiconductor chip 2 is brought into contact with the bottom surface of the accommodating portion 1e by way of the projections 1f having a relatively small area; and, hence, even when a resin having a high tackiness, such as a polyimide resin or the like, is exposed on the main surface of the semiconductor chip 2, it is possible to prevent the semiconductor chip 2 from adhering to the bottom surface of the accommodating portion 1e. Particularly, in this embodiment 1, by forming the projections 1f in a semispherical shape, it is possible to further decrease the contact area between the projections 1f and the main surface of the semiconductor chip 2, and, hence, the ability to prevent the semiconductor chip 2 from sticking can be further enhanced.

Here, the shape of the projections 1f is not limited to a semispherical shape, and the projections 1f can be changed to have various shapes. For example, the projections 1f may be formed in a columnar shape, as shown in FIG. 10, or they may be formed in a conical shape, as shown in FIG. 11. As shown in FIG. 12, a distal end of the projection 1f may be recessed. Further, a dull finish treatment may be applied to the surfaces of the projections 1f. When the projections 1f are formed to have a semispherical shape, it is possible to reduce the above-mentioned contact area, compared to the case in which the projections 1f are formed to have a columnar shape. Further, since such projections 1f have no corner portions compared with the columnar shape or the cone shape, it is possible to prevent a portion of the projection 1f from being chipped or damaged, whereby the lifetime of the tray 1 can be prolonged.

When the projections 1f are formed to have a conical shape or a shape in which the distal end thereof is indented, it is possible to further reduce the above-mentioned contact area compared to that provided by a semispherical shape.

As described above, according to the embodiment 1, it is possible to prevent the phenomenon in which the semiconductor chip 2 adheres to the back surface of the tray 1. In a falling test which the inventors of the present invention actually carried out, it was confirmed that no adhering of the semiconductor chip 2 occurred.

Further, according to this embodiment 1, the projections 1f are arranged at a fixed interval in a uniformly scattered manner at five portions in total, consisting of portions in the vicinity of the four corners and the center of the accommodating portion 1e, for example. During transport of the semiconductor chip 2 using the tray 1, there may be a case in which the stacked body, which is formed by stacking the trays 1 in multiple stages, is turned up-side-down. Then, in a state in which the semiconductor chips 2 are in contact with the bottom surfaces of the accommodating portions 1e formed over the back surface side of the trays 1 (that is, in a state in which the semiconductor chips 2 are turned up-side-down), the semiconductor chips 2 are taken out from the trays 1 or the appearance of the semiconductor chip 2 is inspected. In such a case, when the number of projections 1f formed over the bottom surface of the accommodating portion 1e is two or less, or the projections 1f are extremely biased in one region, the semiconductor chips 2 tend to become inclined, whereby the semiconductor chips 2 cannot be smoothly taken out or the inspection thereof cannot be performed. On the contrary, according to this embodiment 1, by arranging the plurality of projections 1f in a uniformly scattered manner, it is possible to prevent the semiconductor chip 2 from becoming inclined when the semiconductor chip 2 is supported on the bottom surface of the accommodating portion 1e formed over the back surface side of an upper tray 1, whereby it is possible to smoothly takeout the chip and perform an appearance inspection of the semiconductor chip 2. Although the number of projections 1f within each accommodating portion 1e is not limited to five and can be changed to various numbers, for example, usually three to ten, and preferably four or five, projections 1f are provided. FIG. 13 shows an example of an arrangement in which three projections 1f are provided. A group of three projections 1f are arranged at positions which correspond to the center of the main surface of the semiconductor chip 2. Further, the respective projections 1f are arranged at peaks of an equilateral triangle. Due to such an arrangement, the projections 1f can support the semiconductor chip 2 without causing the semiconductor chip 2 to become inclined.

Further, the regions having no projections imply portions which can ensure a sufficient distance from the main surface of the semiconductor chip 2 due to the presence of the projections 1f. That is, in the above-mentioned example, for instance, the regions having no projections imply portions of the bottom surface of the accommodating portion 1e of the tray 1 which are formed at positions spaced away from distal ends of the projections in the projection lengthwise direction by 40 μm or more at a minimum, and preferably by 80 μm or more. In this manner, the regions having no projections constitute portions which are more remote from the chip due to the projections 1f, and, hence, the surface condition of the regions having no projections is not limited to a flat state. That is, even when other projections are formed over the regions having no projections, or a dull finish treatment is applied to the regions having no projections, so long as the portions having other smaller projections or provided with the dull finish treatment are sufficiently more remote from the chip due to the projections 1f, the portions are considered as regions having no projections, including portions to which other smaller projections or a dull finish treatment are provided.

Further, the projections 1f are integrally formed with the tray 1, and, hence, the projections 1f can be easily formed, while the number of parts is not increased, whereby the provision of the projections 1f does not increase the manufacturing cost of the tray 1.

Here, depth H of the accommodating portion 1c (see FIG. 8) is approximately 100 µm, for example. Further, the depth J of the accommodating portion 1e is approximately 190 µm, for example.

Next, one example of the method for transporting the semiconductor device and the method for manufacturing the semiconductor device of this embodiment will be explained in conjunction with FIG. 14 to FIG. 23.

Figure 14:
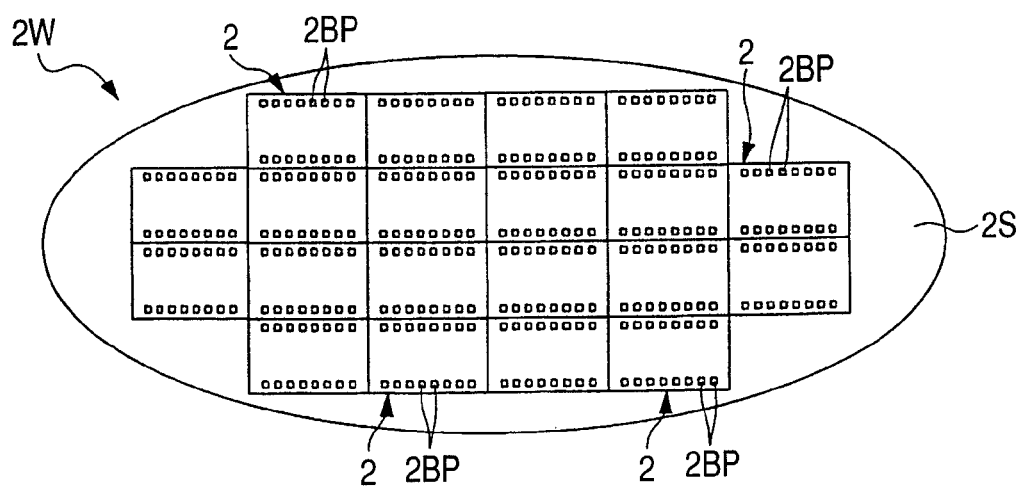
FIG. 14 is an overall plan view showing a main surface of a semiconductor wafer in a step in the manufacture of a semiconductor device which constitutes one embodiment of the present invention.
Figure 15:
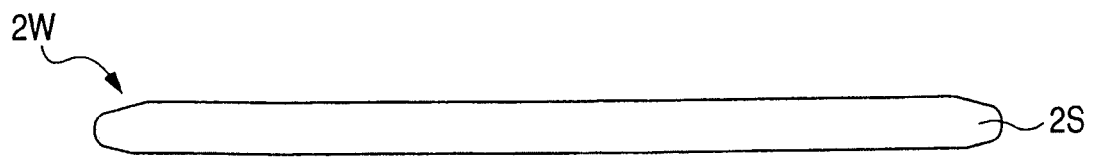
FIG. 15 is a side view of the semiconductor wafer shown in FIG. 14.

FIG. 14 is an overall plan view of a semiconductor wafer (hereinafter simply referred to as a "wafer") 2W, and FIG. 15 is a side view of the wafer 2W shown in FIG. 14.

On the wafer 2W, a plurality of semiconductor chips 2 are formed. On a main surface of each semiconductor chip 2, a die, lines and bonding pads 2BP are formed through preprocessing steps (wafer process), such as a step of introducing impurities, a step of stacking a conductive film and an insulation film, a step of etching the conductive film and the insulation film and the like. The cross-sectional constitution of the semiconductor chip 2 at this stage is substantially equal to the corresponding cross-sectional constitution shown in FIG. 8 and FIG. 9, as described above. The thickness of the wafer 2W at this stage is approximately 280 µm, for example.

Figure 16:
FIG. 16 is a side view of the semiconductor wafer in a step in the manufacture of the semiconductor device which follows the step shown in FIG. 14 and FIG. 15.
Figure 17:
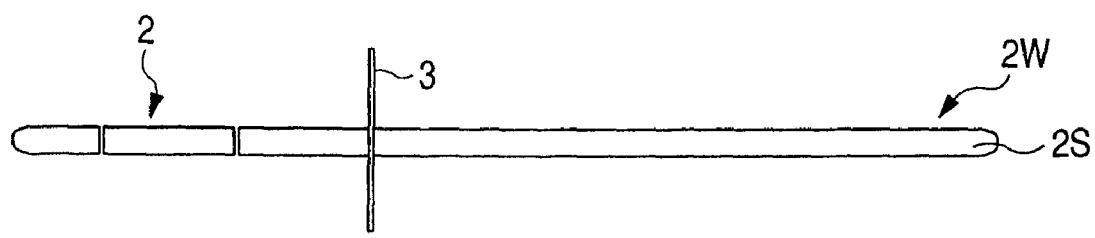
FIG. 17 is a side view of the semiconductor wafer in a dicing step in the manufacture of the semiconductor device which follows the step shown in FIG. 16.
Figure 18:
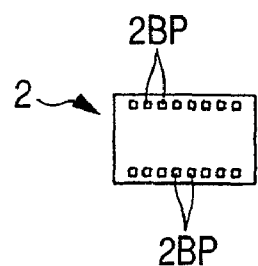
FIG. 18 is an overall plan view of a main surface of a semiconductor chip which has been cut out from the semiconductor wafer in the dicing step shown in FIG. 17.

Subsequently, by applying grinding treatment, polishing treatment, etching treatment or a composite of these treatments to the back surface of the wafer 2W, as shown in a side view of the wafer 2W in FIG. 16, the thickness of the wafer 2W is reduced. Here, the thickness of the wafer 2W is reduced to 90 µm. Thereafter, as shown in FIG. 17, by cutting the wafer 2W with the dicing blade 3 of a dicer, individual semiconductor chips 2 are taken out from the wafer 2W.

Figure 19:
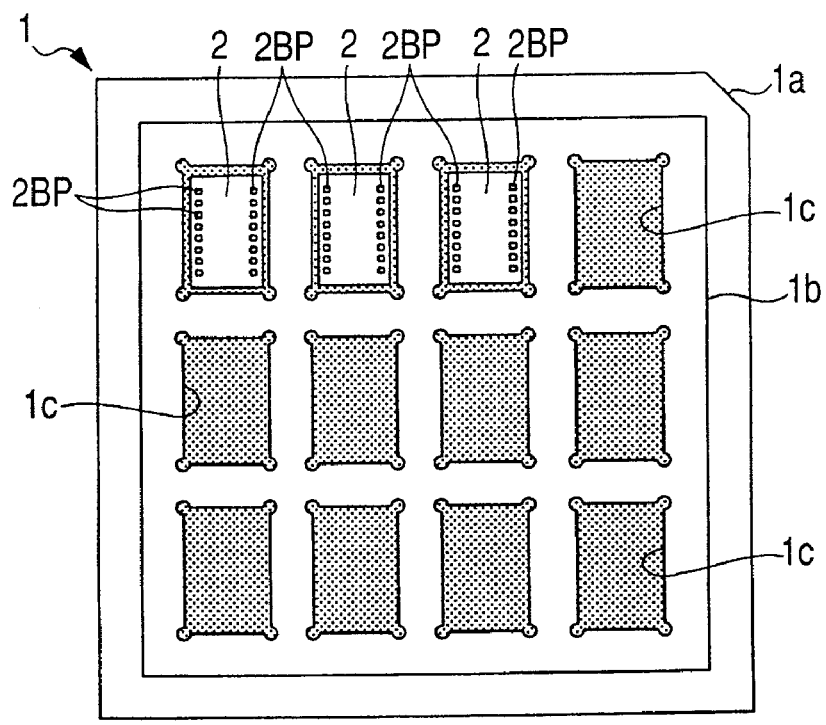
FIG. 19 is an overall plan view of a main surface of a tray showing a state in which semiconductor chips as shown in FIG. 18 are accommodated in the tray.
Figure 20:
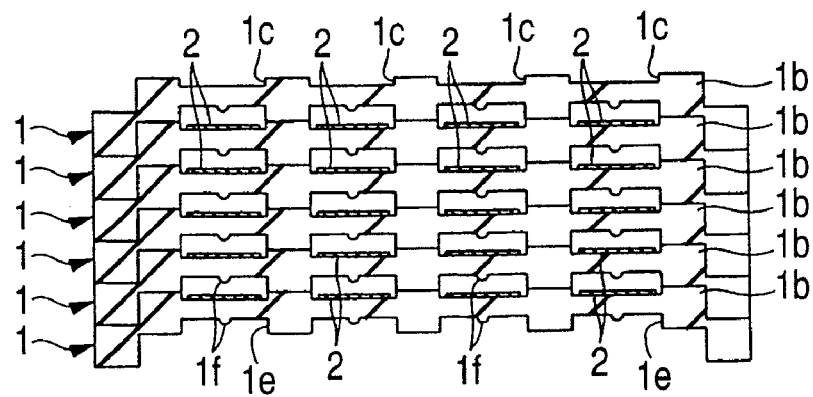
FIG. 20 is a cross-sectional view of the tray showing a state in which trays such as shown in FIG. 19 are stacked in multiple stages.

Next, as shown in FIG. 19, the respective semiconductor chips 2 are placed in the individual accommodating portions 1c formed over the main surface of the tray 1. Then, as shown in FIG. 20, a plurality of trays 1 are stacked in multiple stages to form a set, and several sets of the vinyl trays 1 are packed in an exclusive-use bag and are transported to a given place. In this manner, it is possible to carry the plurality of semiconductor chips 2 to a desired place in a state in which the semiconductor chips 2 are protected from the external environment. Here, although FIG. 19 is a plan view, a hatching in a dull pattern is added to the surface which to a dull finish treatment is applied.

Subsequently, at the transport destination, the trays 1 in multiple stages are taken out from the exclusive-use vinyl bag. Further, as shown in FIG. 21, the respective semiconductor chips 2 which are accommodated in the tray 1 are automatically taken out using an automatic takeout mechanism or the like, and each semiconductor chip 2 is mounted on a chip mounting region of a printed circuit board 4.

Figure 21:
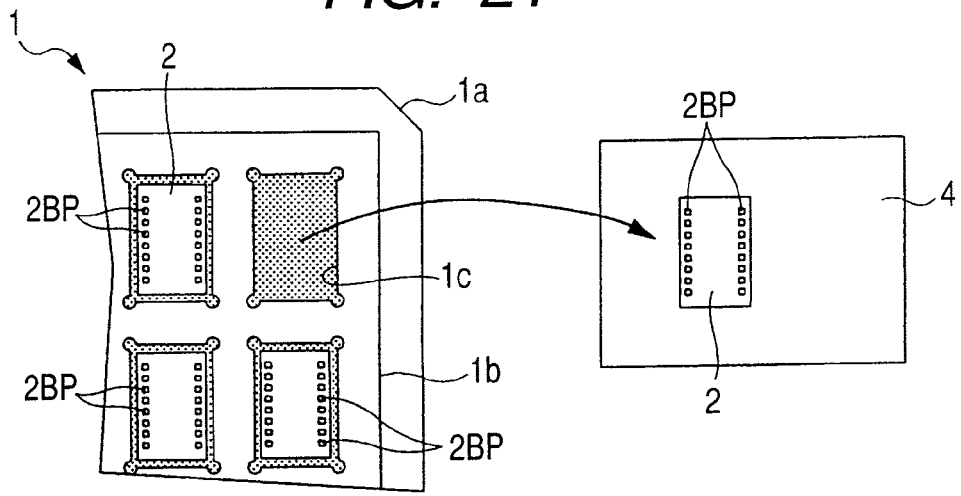
FIG. 21 is a diagram showing a step for mounting the semiconductor chip on a printed circuit board.

FIG. 21 shows a case in which the main surface of the semiconductor chip 2 is directed upwardly and the back surface of the semiconductor chip 2 is in contact with the printed circuit board 4. At this point of time, according to the embodiment 1, since it is possible to prevent the semiconductor chips 2 from adhering to the back surface of the upper-stage tray 1, it is possible to smoothly and automatically take out the semiconductor chips 2 from the accommodating portions 1c that are formed over the main surface of the tray 1 and, at the same time, to mount the semiconductor chips 2 on the main surfaces of the printed circuit boards 4. Here, the left side of FIG. 21 shows a plan view of part of a main surface of the tray 1 and the right side of FIG. 21 shows a plan view of a part of the main surface of the printed circuit board 4. Although the left side of FIG. 21 is a plan view, a hatching in a dull pattern is added to the surface to which a dull finish treatment is applied.

Figure 22:
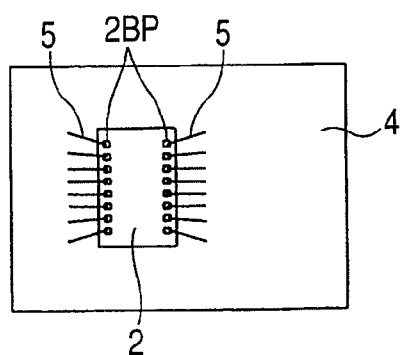
FIG. 22 is a diagram showing a wire bonding step.
Figure 23:
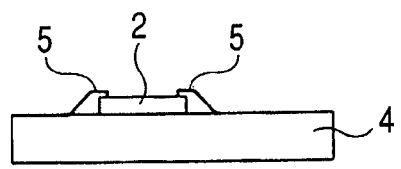
FIG. 23 is a side view of the part of the printed circuit board shown in FIG. 22.

Thereafter, the printed circuit board 4 is transferred to a wire bonder and, as shown in FIG. 22 and FIG. 23, the bonding pads 2BP of the semiconductor chip 2 and the lands (electrodes) of the printed circuit board 4 are electrically connected with each other using bonding wires 5. Here, FIG. 22 is a plan view of part of the printed circuit board 4, and FIG. 23 is a side view of the printed circuit board 4 shown in FIG. 22.

Thereafter, the semiconductor device is manufactured through a usual sealing step in the fabrication of the semiconductor chip 2.

Embodiment 2

Figure 24:
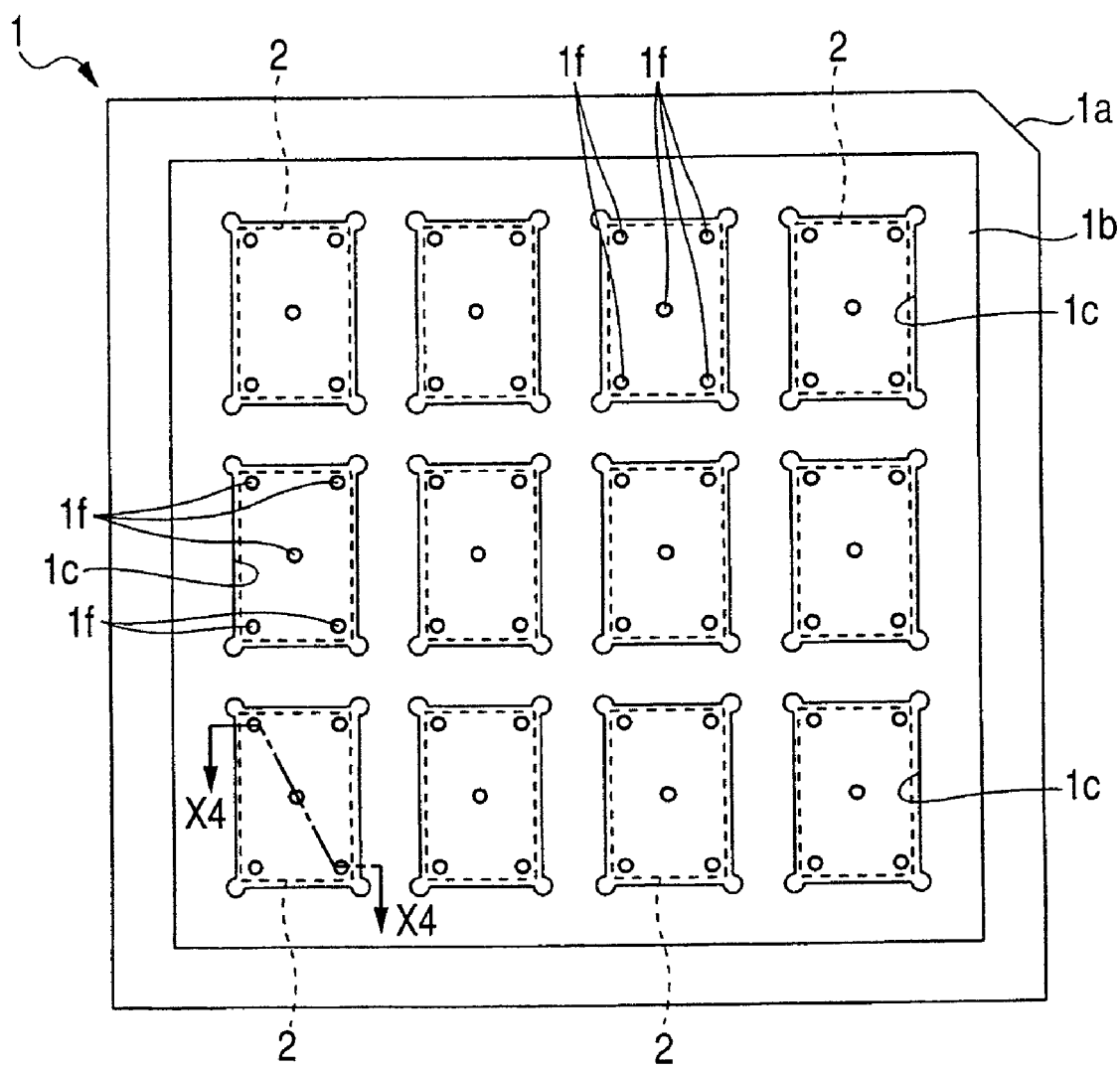
FIG. 24 is an overall plan view of a main surface of a tray used in a method of transporting semiconductor devices, which constitutes another embodiment of the present invention, in which are stacked in two stages.
Figure 25:
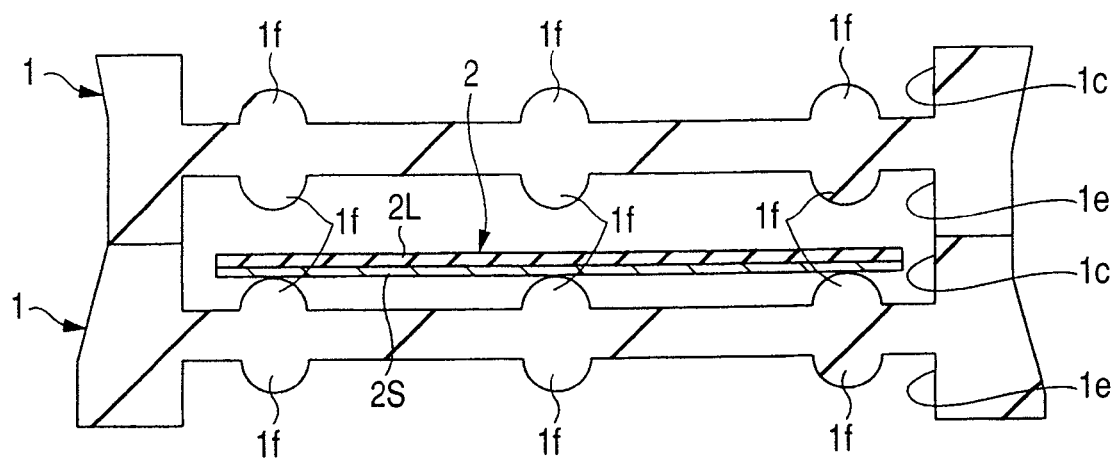
FIG. 25 is a cross-sectional view taken along a line X4-X4 in FIG. 24.

FIG. 24 is an overall plan view of a main surface of the tray 1, which is used in a method of manufacture of semiconductor devices which constitutes another embodiment of the present invention, showing trays stacked in two stages, and FIG. 25 is a cross-sectional view taken along a line X4-X4 in FIG. 24.

In this embodiment 2, a dull finish treatment is not applied to the bottom surfaces of the accommodating portions 1c formed over the main surface of the tray 1. However, in the same manner as the accommodating portions 1e formed over the back surface of the tray 1, projections 1f are formed over the bottom surfaces of the accommodating portions 1c.

That is, as mentioned previously, in the transport of the semiconductor chips 2 using the trays 1, there may be a case in which it is necessary to take out the semiconductor chip 2 from the tray 1 or to inspect the appearance or the like of the tray 1 in a state in which the stacked body formed by laminating the trays 1 in multiple stages is turned up-side-down, or the semiconductor chips 2 are turned up-side-down. In such a case, when the semiconductor chip 2 continues to adhere to the accommodating portion 1c formed over the main surface of the tray 1 due to static electricity, it is impossible to take out the semiconductor chip 2 or to inspect the semiconductor chip 2. Accordingly, it is necessary to prevent adhesion of the semiconductor chip 2 to the main surface of the tray 1. From the above-mentioned viewpoint, in this embodiment, the projections 1f are also formed over the accommodating portions 1c that are formed over the main surface of the tray 1. Except for the above-mentioned structural feature, this embodiment 2 is the same as the embodiment 1.

In this manner, according to the embodiment 2, it is possible to prevent the semiconductor chips 2 from adhering to the main surface side of the tray 1 when the trays 1, which are stacked in multiple stages, are turned up-side-down.

Embodiment 3

Figure 26:
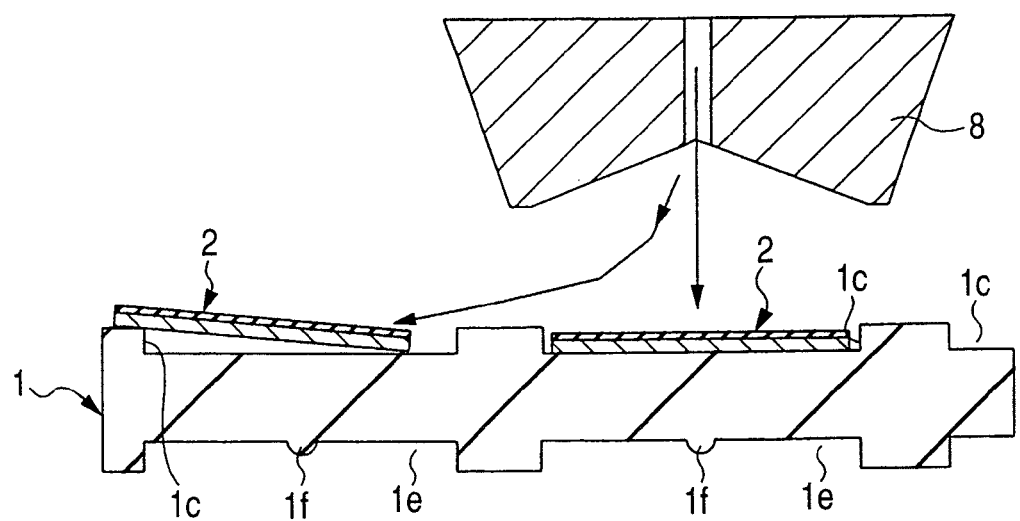
FIG. 26 is which illustrates a drawback which arises when the semiconductor chip is accommodated in a tray.
Figure 27:
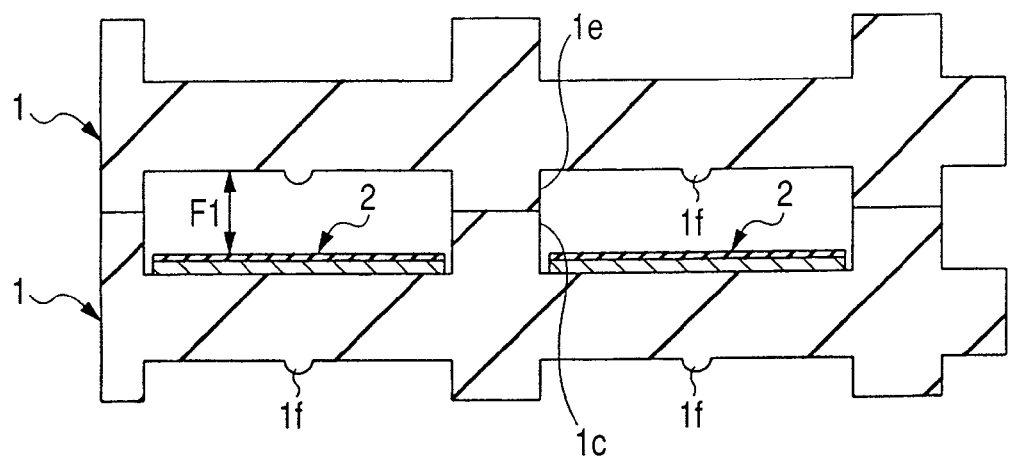
FIG. 27 is a diagram which illustrates a drawback which arises when the semiconductor chip is transported.

First of all, a problem which was originally discovered by the inventors of the present invention is explained. Along with the reduction of the thickness of the semiconductor chips, the chip accommodating portions of the tray which is used for transporting the semiconductor chips are becoming more shallow. However, when the chip accommodating portions are excessively shallow, at the time of placing the semiconductor chip in the chip accommodating portion, or at the time of taking out the semiconductor chip from the chip accommodating portion, there arises a drawback in that the accommodating/takeout operations may influence another semiconductor chip which is already accommodated in another nearby chip accommodating portion, whereby the other semiconductor chip may be expelled to the outside of the chip accommodating portion in which it has been resting. FIG. 26 shows one example of such a drawback, that is, it shows a state in which the semiconductor chip 2 is accommodated in a given accommodating portion 1*c*. In general, to accommodate the semiconductor chip 2 to the accommodating portion 1*c* of the tray 1, in a state in which the semiconductor chip 2 is sucked up using a vacuum by a collet 8, the semiconductor chip 2 is moved to a desired accommodating portion position of the tray 1. Thereafter, the vacuum suction state of the collet 8 is released to make the semiconductor chips 2 fall on the desired accommodating portions 1*c*, thus accommodating the semiconductor chip 2. However, in a state in which the reduction of thickness of the semiconductor chip 2*a* is such the thickness becomes approximately 100 μm or less, even when the vacuum suction state of the collet 8 is merely released, there arise drawbacks in that the semiconductor chip 2 is not removed from the collet 8, or it is difficult to remove the semiconductor chip 2 from the collet 8, so that the semiconductor chip 2 cannot be accurately placed in the accommodating portion 1*c*. Accordingly, at the time of placing the semiconductor chips 2 into the accommodating portions 1*c*, as indicated by an arrow in FIG. 26, air is reversely blown to remove the semiconductor chips 2 from the collet 8 and to place the semiconductor chips 2 in the desired accommodating portions 1*c*. However, since the accommodating portion 1*c* of the tray 1 is shallow and, at the same time, the semiconductor chip 2 is thin and light-weight, there arises a drawback in that, due to the influence of the air flow from the collet 8, another semiconductor chip 2 which is already accommodated in an adjacent accommodating portion 1*c* may be expelled to the outside of the accommodating portion 1*c* in which it has been resting. Here, it may be possible to increase the depth of the accommodating portion 1*c* of the tray 1 with respect to the thickness of the semiconductor chip 2. In this case, the drawback attributed to the accommodating/takeout operations of the semiconductor chip 2 may be eliminated. However, when the depth of the accommodating portions 1*c* is simply increased, as shown in FIG. 27, in a state in which the semiconductor chips 2 are accommodated in the tray 1, the distance F1 from the main surface of the semiconductor chip 2 to the back surface of the tray 1 which faces the main surface in an opposed manner is elongated; and, hence, the semiconductor chip 2 is liable to be easily moved upwardly and downwardly or rotated during the transport of the semiconductor chip 2, whereby there arise drawbacks in that the semiconductor chips 2 may suffer from damage, chipping or the like, or a portion of the tray 1 may be shaved or abraded due to the movement of the semiconductor chip 2, thus forming a foreign substance in the tray.

Accordingly, this embodiment 3 provides trays which can ensure the provision of accommodating portions having a sufficient depth to prevent surrounding semiconductor chips from being displaced at the time of taking them out or accommodating a semiconductor chip therein, and, at the same time, which can ensure the provision a depth sufficient to prevent the vertical movement and the rotation of the semiconductor chips in the accommodating portions during the transportation of the semiconductor chips.

Figure 28:
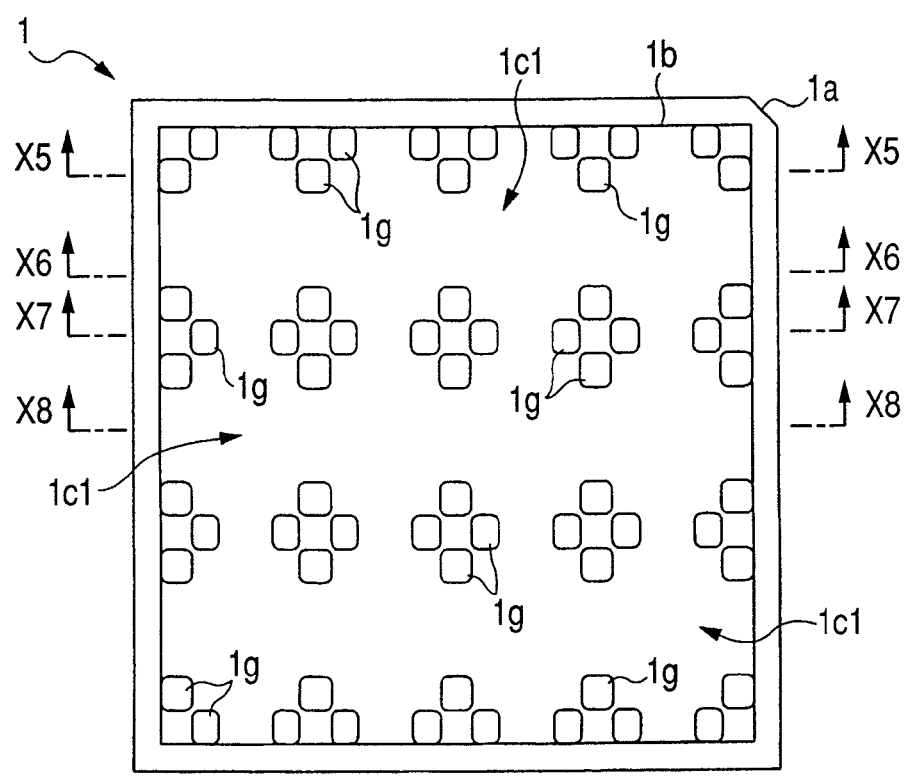
FIG. 28 is an overall plan view showing one example of a main surface of a tray used in the transport of a semiconductor device, which constitutes another embodiment of the present invention.
Figure 29:
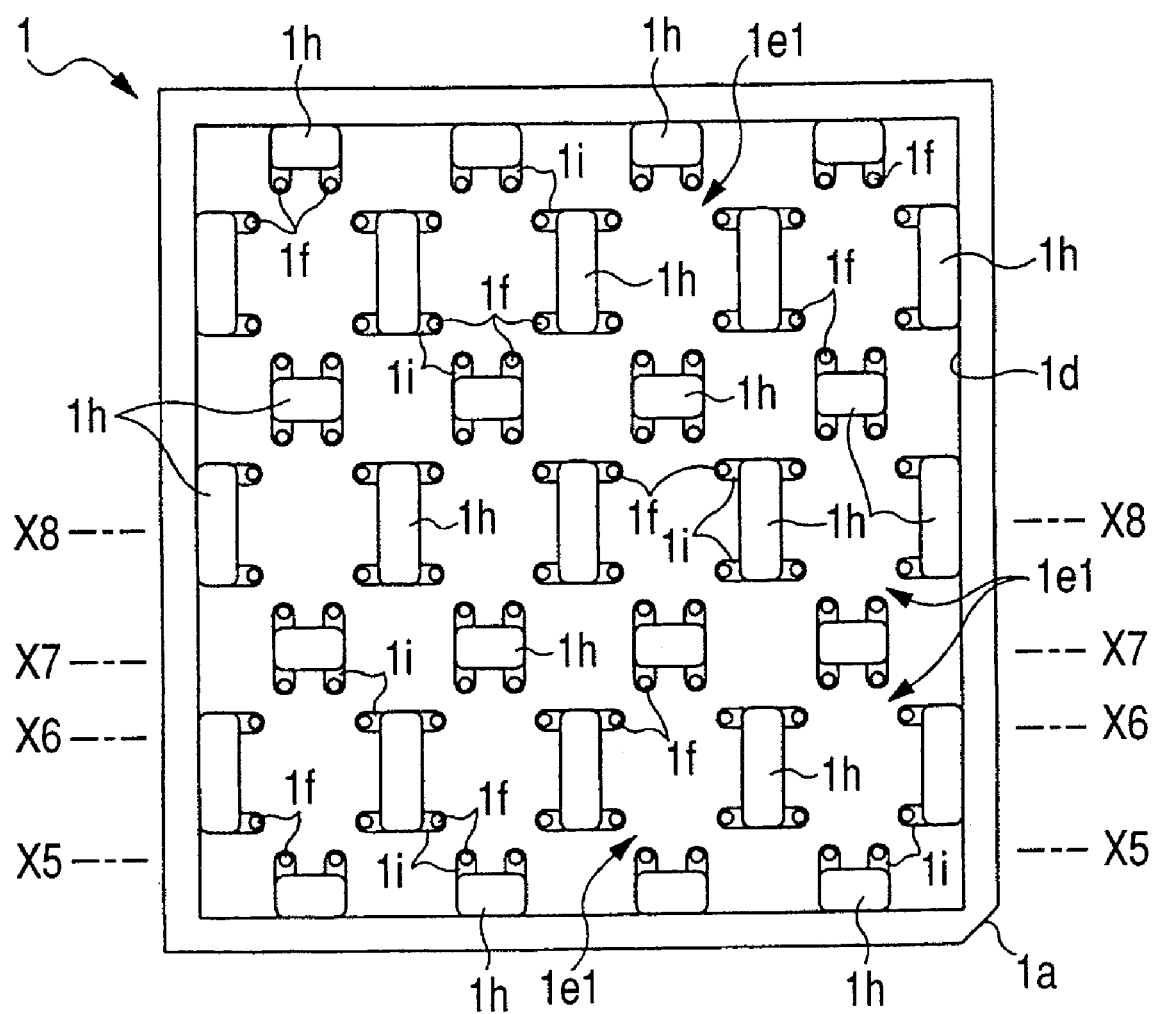
FIG. 29 is an overall plan view showing one example of a back surface of the tray shown in FIG. 28.
Figure 30:
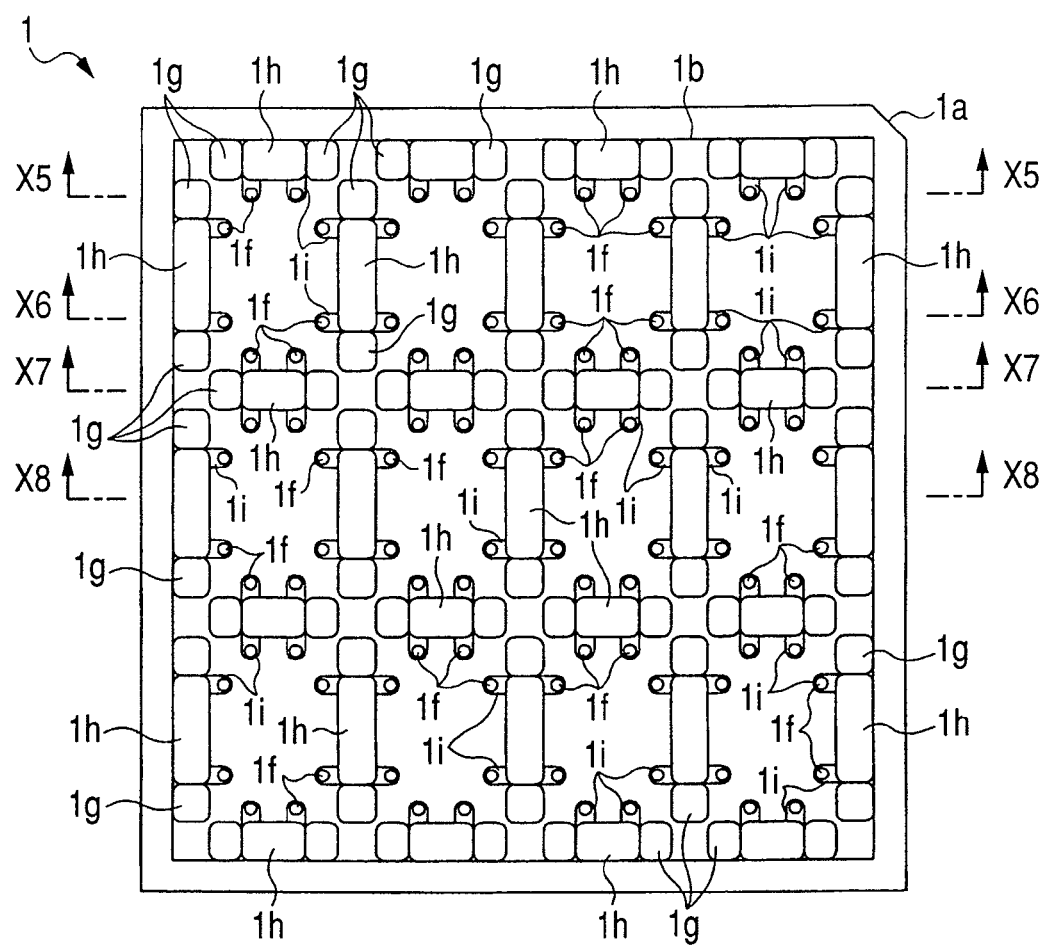
FIG. 30 is an overall plan view showing the constitution of the back surface of the tray, shown in FIG. 29, as seen through the main surface of the tray shown in FIG. 28.
Figure 31:
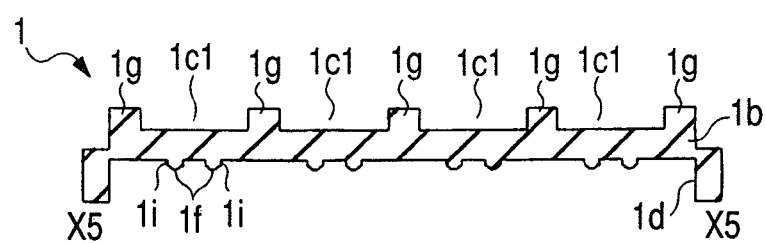
FIG. 31 is a cross-sectional view taken along a line X5-X5 in FIG. 28 to FIG. 30.
Figure 32:
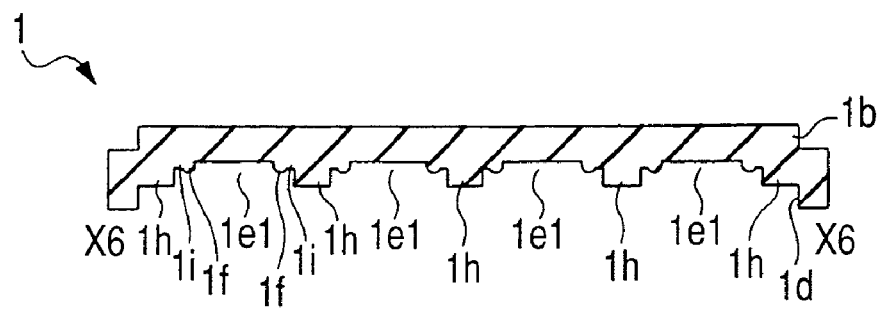
FIG. 32 is a cross-sectional view taken along a line X6-X6 in FIG. 28 to FIG. 30.
Figure 33:
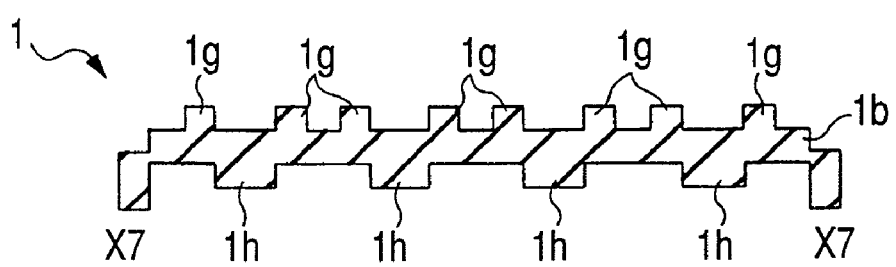
FIG. 33 is a cross-sectional view taken along a line X7-X7 in FIG. 28 to FIG. 30.
Figure 34:
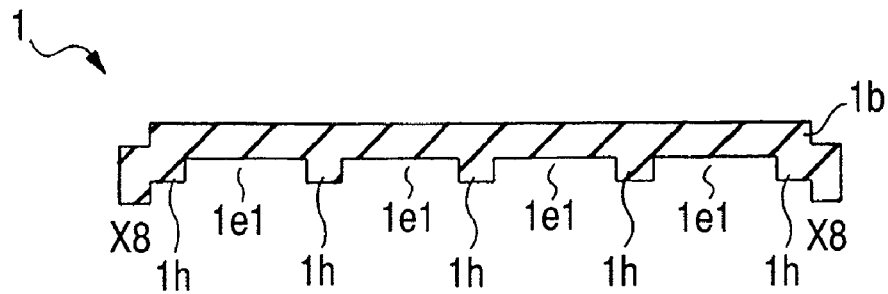
FIG. 34 is a cross-sectional view taken along a line X8-X8 in FIG. 28 to FIG. 30.

FIG. 28 is an overall plan view showing one example of the main surface of a tray 1 of the embodiment 3; FIG. 29 is an overall plan view showing one example of a back surface of the tray 1 shown in FIG. 28; FIG. 30 is an overall plan view showing the constitution of the back surface of the tray 1 in FIG. 29 as seen through the main surface of the tray shown in FIG. 28; and FIG. 31 to FIG. 34 are cross-sectional views taken along lines X5-X5 to X8-X8 in FIG. 28 to FIG. 30, respectively.

Since the overall profile, profile size and constitutional material of the trays 1 of this embodiment 3 are the same as those of the previously mentioned embodiment, a repeated explanation thereof is omitted. On the main surface of the tray 1, a plurality of projecting columns (first projecting portions) 1*g*, which project in a direction perpendicular to the main surface, are integrally formed with the tray 1. The projecting columns 1*g* are members which define upper and lower, as well as left and right, boundaries of spaces which accommodate respective ones of a plurality of semiconductor chips mounted on the main surface side of the tray 1, thus forming accommodating portions (first accommodating portions) 1*c*1 of the respective semiconductor chips.

On the back surface of the tray 1, a plurality of projecting walls (second projecting portions) 1*h*, which project in the direction perpendicular to the back surface, are integrally formed with the tray 1. The projecting walls 1*h* constitute members which define upper and lower as well as left and right, boundaries of spaces which accommodate respective ones of a plurality of semiconductor chips mounted on the back surface side of the tray 1, thus forming accommodating portions (second accommodating portions) 1*e*1 of the respective semiconductor chips. When the plurality of trays 1 are stacked in a state such that the back surface of an upper tray 1 is arranged to face the main surface of a lower tray 1 in an opposed manner, the projecting columns 1*g* and the projecting walls 1*h* are arranged such that the projecting walls 1*h* formed over the back surface of the tray 1 fit into the projecting columns 1*g*, which are arranged close to each other on the main surface of the tray 1.

Further, on the bottom surface of each accommodating portion 1*e*1, which is surrounded by the projecting walls 1*h* that are formed over the back surface of the tray 1, a plurality of projecting portions (third projecting portions) 1*i*, which slightly project in the direction perpendicular to the back surface of the tray 1, are integrally formed with the tray 1. As seen in plan view, the respective projecting portions 1*i* also slightly extend in the direction toward the center of the respective accommodating portions 1*e*1. Further, on an upper surface of a distal end side of each projecting portion 1*i*, a projection 1*f*, which projects in the direction perpendicular to the upper surface, is integrally formed with the tray 1. The area of the projection 1*f* is smaller than the area of the upper surface of the projecting portion 1*i*. The function of the projections 1*f* is the same as the function of projections 1*f* described in conjunction with the embodiments 1, 2.

Figure 35:
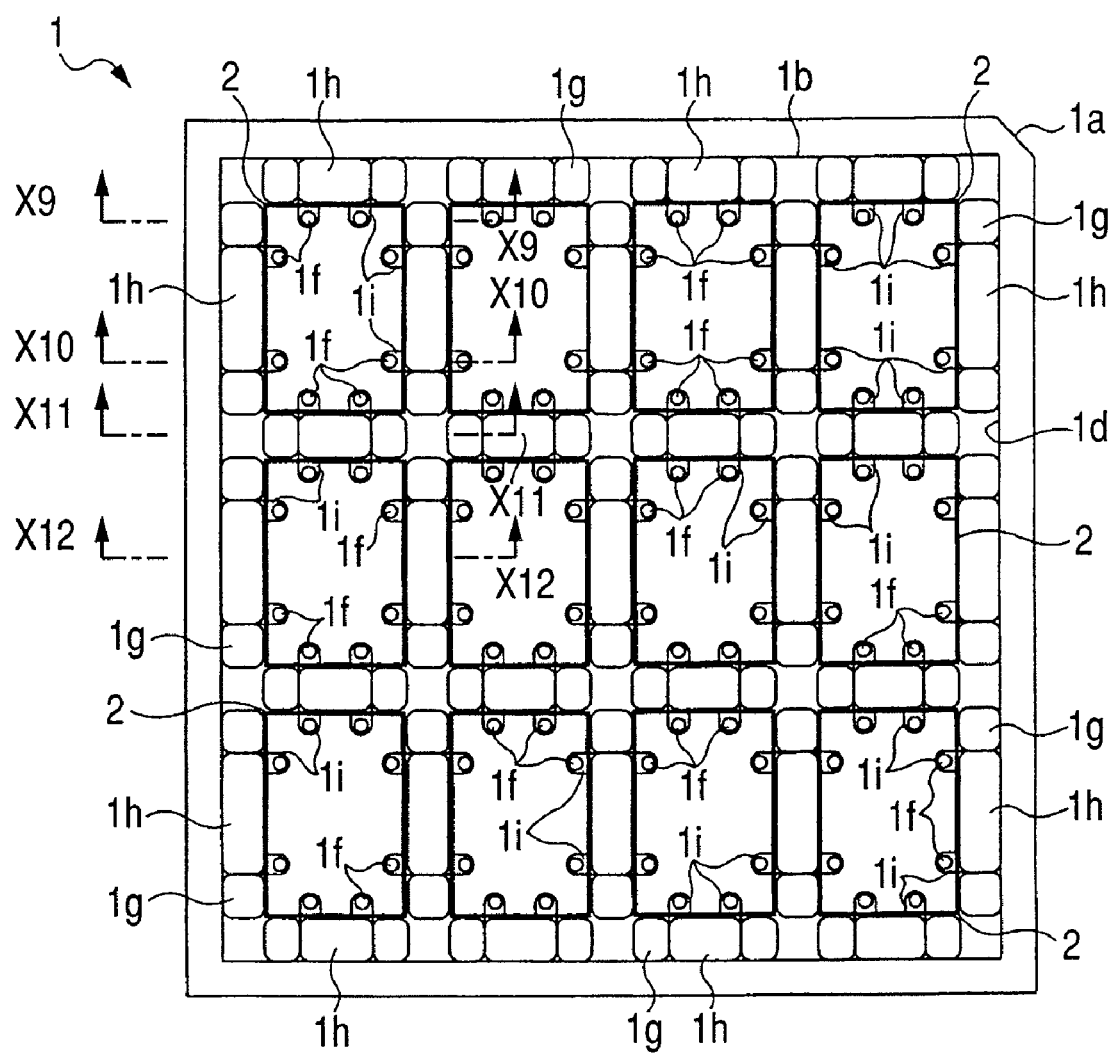
FIG. 35 is an overall plan view of the main surface when the trays shown in FIG. 28 are stacked in a plurality of stages.
Figure 36:
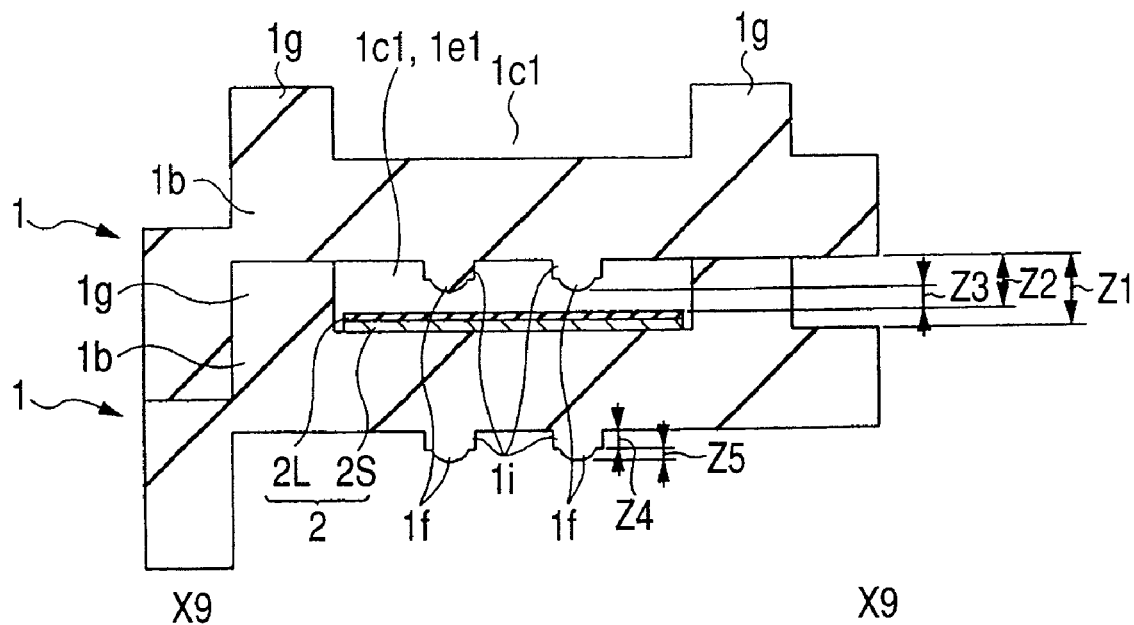
FIG. 36 is a cross-sectional view taken along a line X9-X9 in FIG. 35.
Figure 37:
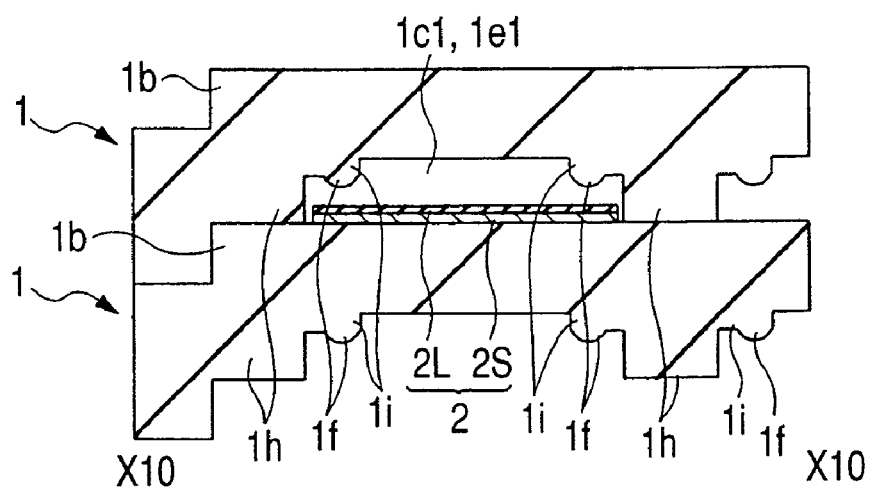
FIG. 37 is a cross-sectional view taken along a line X10-X10 in FIG. 35.
Figure 38:
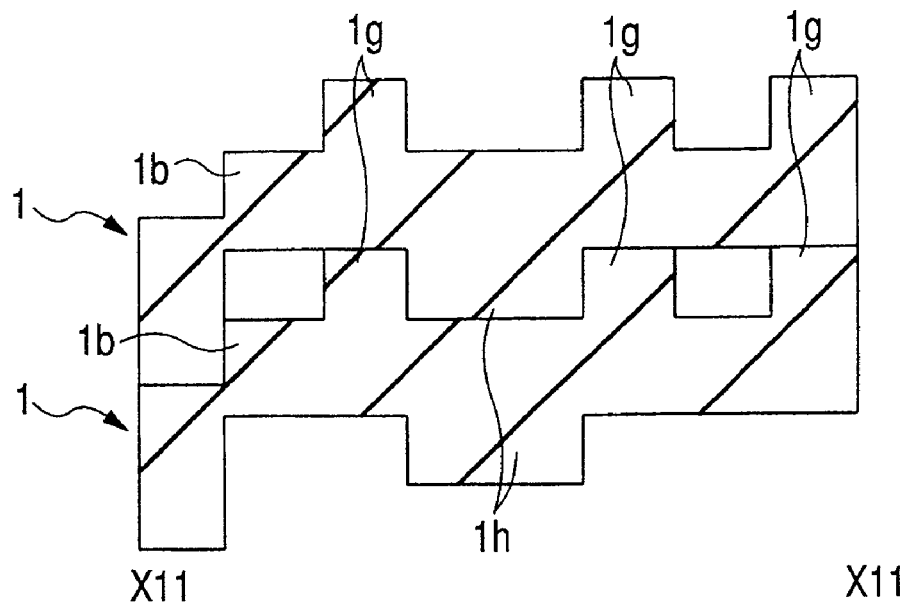
FIG. 38 is a cross-sectional view taken along a line X11-X11 in FIG. 35.
Figure 39:
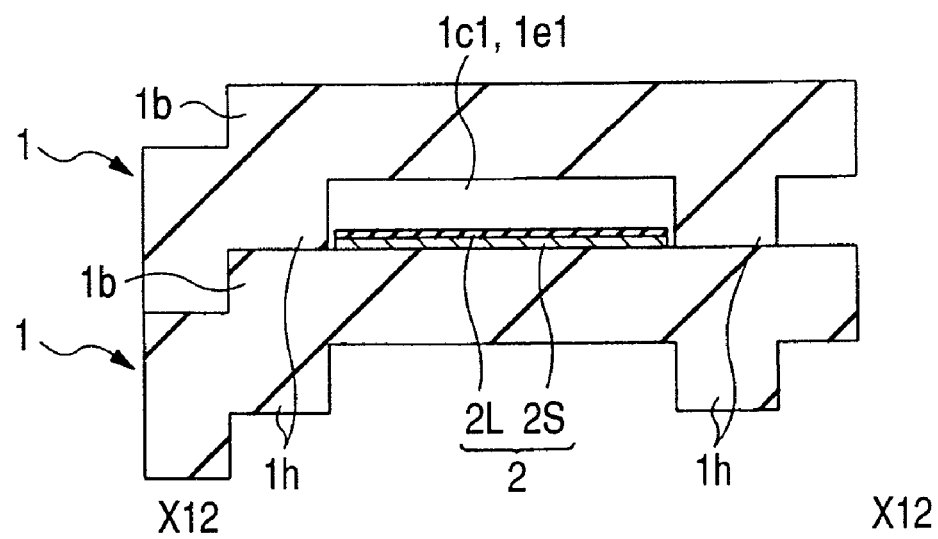
FIG. 39 is a cross-sectional view taken along a line X12-X12 in FIG. 35.
Figure 40:
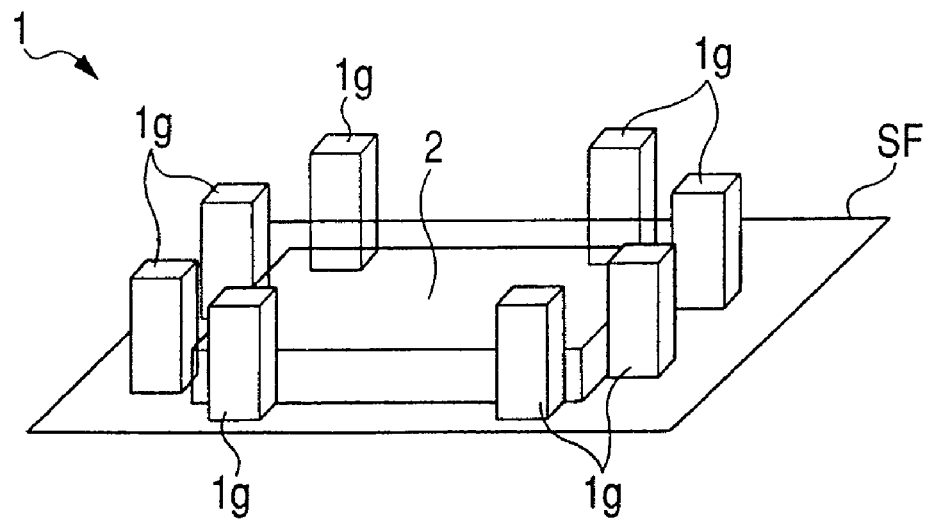
FIG. 40 is a perspective view showing a part of the main surface side of the tray shown in FIG. 35.
Figure 41:
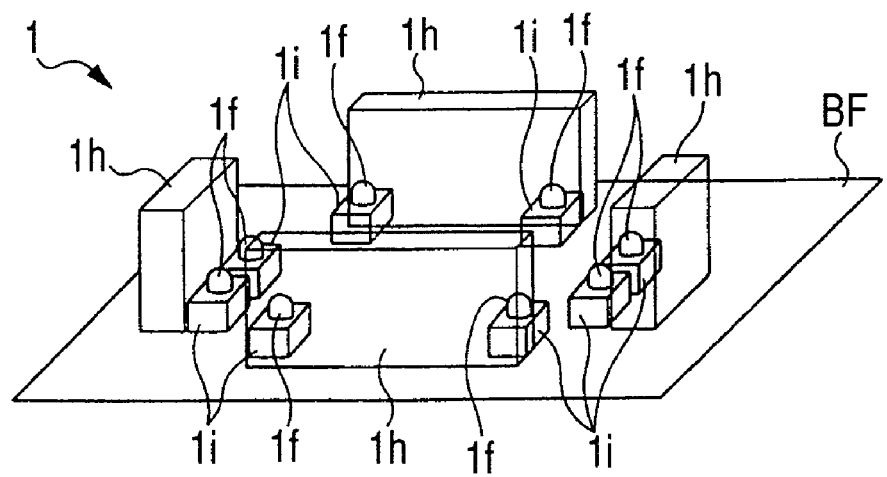
FIG. 41 is a perspective view showing a part of a back surface side of the tray shown in FIG. 35.
Figure 42:
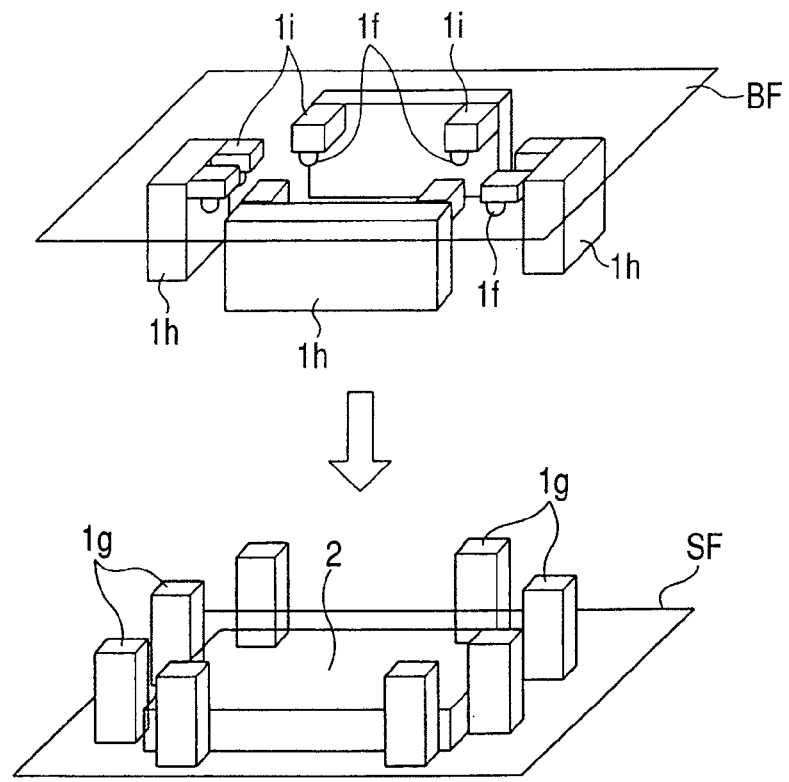
FIG. 42 is a perspective view of part of a tray showing a state in which another tray is stacked on a lower-stage tray which accommodates semiconductor chips therein.
Figure 43:
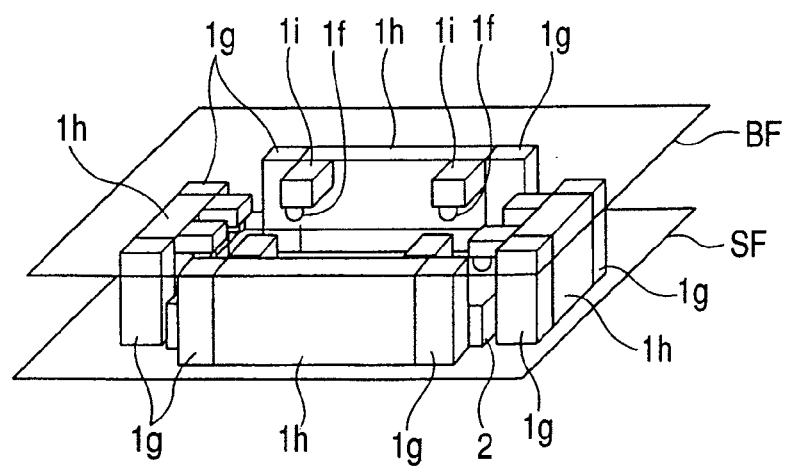
FIG. 43 is a perspective view of part of the tray showing a state in which an upper-stage tray is stacked on a lower-stage tray.

FIG. 35 is an overall plan view of the main surface, when the trays 1 of this embodiment 3 are stacked in a plurality of stages; FIG. 36 to FIG. 39 are respectively cross-sectional views taken along lines X9-X9, X10-X10, X11-X11 and X12-X12 in FIG. 35, FIG. 40 is a perspective view of part of a main surface side of the tray 1 of this embodiment 3; FIG. 41 is a perspective view of part of a back surface side of the tray 1 of this embodiment 3; FIG. 42 is a perspective view of part of the tray 1, showing a state in which another tray 1 is stacked on a lower-stage tray 1, which accommodates the semiconductor chips 2 therein; and FIG. 43 is a perspective view of part of the tray 1 showing a state in which an upper-stage tray 1 is stacked on a lower-stage tray 1.

Here, in FIG. 35, the state of the inside of the tray 1 is shown as seen through the main surface of the upper tray, such that the state of the inside of the tray 1 can be understood. Further, with respect to FIG. 40 to FIG. 43, the states of portions of the tray 1 are shown in a similar see-through manner. Further, symbol SF in FIG. 40 to FIG. 43 indicates the main surface of the tray 1, while symbol BF in FIG. 41 indicates the back surface of the tray 1.

The semiconductor chips 2 are accommodated in the tray 1 in a state that such the back surfaces thereof are mounted on the main surface of a lower-stage tray, and, at the same time, the main surfaces (surfaces on which wiring layers 2L are formed) thereof are directed towards the back surface of the upper-stage tray 1. Since the constitution of the semiconductor chip 2 is the same as the corresponding constitution of the semiconductor chip 2 described in connection with the embodiment 1, a repeated explanation thereof is omitted. The projecting columns 1g and the projecting walls 1h are arranged along the outer peripheries of the areas accommodating the semiconductor chips 2. However, the projecting columns 1g and the projecting walls 1h are arranged, while avoiding the corner portions of the semiconductor chips 2, such that the projecting walls 1g and the projecting walls 1h are not brought into contact with the corner portions of the semiconductor chips 2. This is due to the fact that, since the corner portions of the semiconductor chips 2 are weak in their resistance against mechanical shock or the like compared to other portions, there arises a drawback in that the corner portions of the semiconductor chips are easily chipped or abraded when the corner portions of the semiconductor chips 2 hit the projecting columns 1g or the projecting wall 1h at the time of transporting the semiconductor chips 2 using the trays 1. That is, by arranging the projecting columns 1g and the projecting walls 1h such that the projecting walls 1g and the projecting walls 1h are not brought into contact with the corner portions of the semiconductor chips 2, it is possible to suppress or prevent the corner portions of the semiconductor chips 2 from being chipped or abraded at the time of transporting the semiconductor chips 2 using the trays 1. Accordingly, the yield rate and the reliability of the semiconductor chips 2 can be enhanced.

In this embodiment 3, the height Z1 of the projecting columns 1g (that is, the depth of the accommodating portion 1c1 and also the height from the main surface of the tray 1 to an upper surface of the projecting column 1g) is set so as to be sufficiently greater than the thickness of the semiconductor chip 2. Accordingly, when the semiconductor chip 2 is accommodated into the accommodating portion 1c1 or is taken out from the accommodating portion 1c1, it is possible to prevent the possibility that the semiconductor chip 2 around the accommodating portion 1c1 will be subjected to the influence of the takeout/accommodating operation to the extent that it will be expelled from the accommodating portion 1c1. Thus, although the height Z1 is not specifically limited, the height Z1 is approximately 0.6 mm, for example. On the other hand, at the time of transporting the semiconductor chip 2, the semiconductor chip 2 is accommodated in the accommodating portion 1c1 of the tray 1; and, thereafter, in a state in which the back surface of the upper-stage tray 1 is arranged to face the main surface side of the lower-stage tray 1, as shown in FIG. 42, the main surface side of the lower-stage tray 1 is covered with the upper-side tray 1, as shown in FIG. 43. Here, when the trays 1 are stacked, the projecting columns 1g formed over the main surface of the lower-stage tray 1 and the projecting walls 1h formed over the back surface of the upper-stage tray 1 are engaged with each other. Accordingly, even when the depth of the accommodating portion 1c1 is set to a depth which does not cause the above-mentioned drawback by increasing the height of the projecting columns 1g, it is possible to prevent the distance from the main surface of the semiconductor chip 2, that is accommodated in the tray 1, to the back surface of the upper-stage tray 1 from taking an extremely large value. Particularly in this embodiment 3, since the projecting portions 1i and the projections 1f are formed over the back surface of the tray 1, the height above the main surface of the semiconductor chip 2 can be further decreased. Accordingly, it is possible to suppress the movement of the semiconductor chip, such as a vertical movement or a rotation, at the time of transporting the semiconductor chip 2 using the tray 1; and, hence, it is possible to suppress or prevent the possibility that flaws, chipping or the like will be generated in the semiconductor chip 2, or that foreign substances will be generated due to the abrasion of portions of the tray 1 in the course of transportation or movement of the semiconductor chip 2. The distance Z2 from the main surface of the semiconductor chip 2 to the back surface of the upper-stage tray 1, which the main surface faces in an opposed manner, is not particularly limited. However, the distance Z2 is approximately 0.5 mm, for example. Further, although the distance Z3 from the main surface of the semiconductor chip 2 to a peak point of the projection 1f, which faces the main surface, is not particularly limited, it is approximately 0.22 mm, for example.

The projecting portions 1i may occupy a relatively wide area, such that the projecting portions 1i extend over the whole bottom surface of the accommodating portion 1e1. However, since the projecting portions 1i and the projections 1f are formed over the surface, which the main surface of the semiconductor chip 2, where a polyimide-based resin film is formed, faces, it is desirable for the projecting portions 1i to have a relatively small area from the view point of suppressing or preventing the adhesion of the semiconductor chip 2, as explained in conjunction with the above-mentioned embodiment 1. From this point of view, the planar area of the projection 1f is set even smaller than the area of an upper surface of the projecting portion 1i. Further, the projection 1f is formed to have a semispherical shape, so as to reduce the contact area with the semiconductor chip 2 as much as possible. Further, since processing a step exists in which the semiconductor chip 2 is accommodated in the accommodating portion 1e1 side, in a state in which the main surface of the semiconductor chip 2 is brought into contact with the projection 1f by inverting the tray 1, or a processing step in exists which the semiconductor chip 2 is picked up in such a state, for making the mounting condition of the semiconductor chip 2 stable during these steps, the plurality of projecting portions 1i in the inside of each accommodating portion 1e are formed to have the same height in cross section and the plurality of projecting portions 1i are preferably arranged to have an up-and-down, as well as a left-and-right, symmetry as seen in plane view. The same goes for the projections 1f. Although not specifically limited, the height (thickness) Z4 of the projecting portion 1i is approximately 0.18 mm, for example, while the height Z5 of the projection 1f is approximately 0.1 mm, for example.

Figure 44:
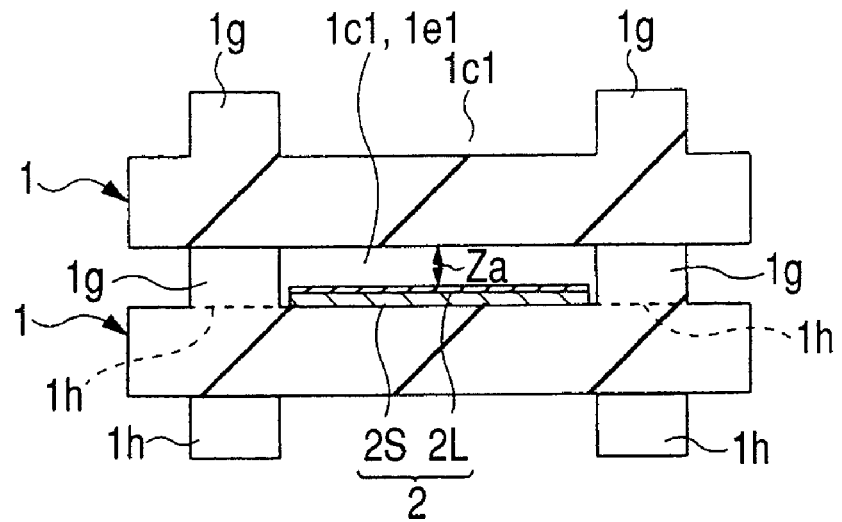
FIG. 44 is a cross-sectional view showing trays, which are used in the transport of the semiconductor device, being stacked in two stages, which constitutes one embodiment of the present invention.
Figure 45:
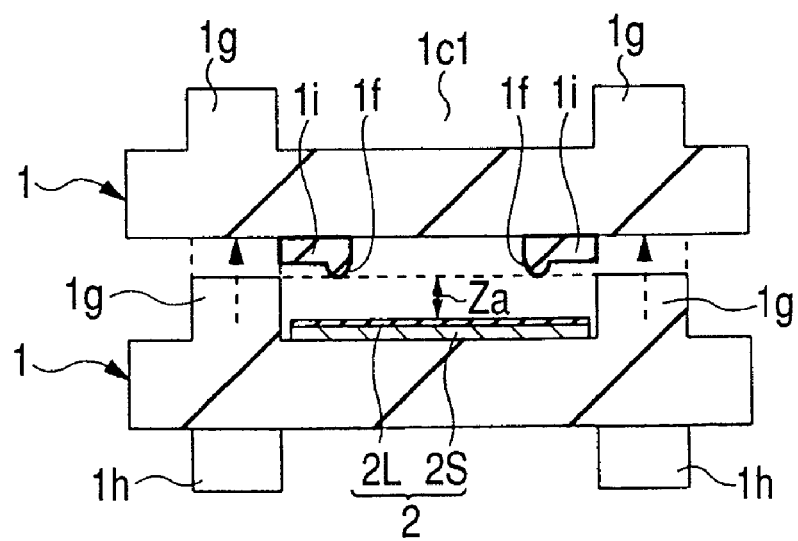
FIG. 45 is a cross-sectional view of stacked trays showing a functional example of projecting portions formed over the back surface of the tray which is used in the transport of a semiconductor device, which constitutes one embodiment of the present invention.
Figure 46:
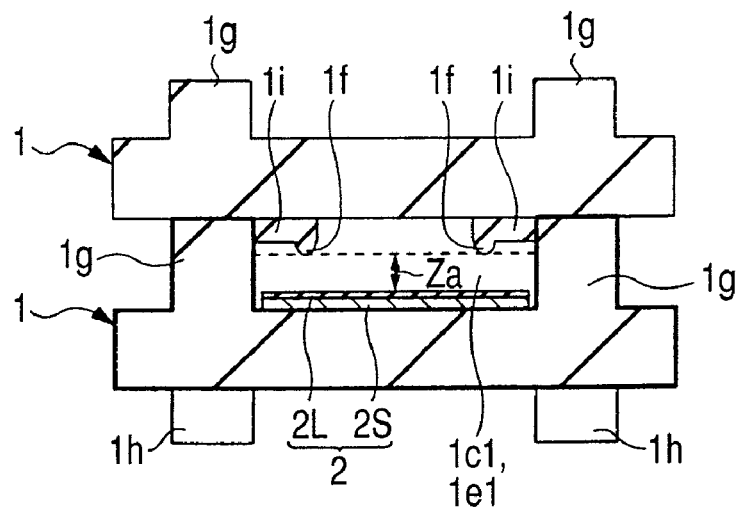
FIG. 46 is a cross-sectional view of stacked trays showing a functional example of projecting portions formed over the back surface of the tray which is used in the transport of the semiconductor device, which constitutes one embodiment of the present invention.

Next, one example of the functions of the projecting portions 1I and the projections 1f will be explained in conjunction with FIG. 44 to FIG. 46. FIG. 44 to FIG. 46 are cross-sectional views of part of the tray 1 of the embodiment 1 in a state in which the trays 1 are stacked in two stages.

First of all, as shown in FIG. 44, in this embodiment 3, the depth of the accommodating portion 1c1, which is formed by a plurality of projecting columns 1g formed over the main surface of the tray 1, is sufficiently increased with respect to the thickness of the semiconductor chip 2. Even in such a case, by engaging the projecting columns 1g that are formed over the main surface of the tray 1 and the projecting walls that are 1h formed over the back surface of the tray 1 every time a plurality of trays 1 are stacked, it is possible to reduce the distance Za from the main surface of the semiconductor chip 2 to the back surface of the tray 1 which faces the main surface in an opposed manner, such that the distance Za does not assume an extremely large value. Here, the distance Za is a maximum size which can ensure the depth of the accommodating portion 1c1 as much as possible and, at the same time, can suppress vertical movement and rotational movement of the semiconductor chip 2 during the transportation of the semiconductor chip 2.

In addition, as shown in FIG. 45, when the above-mentioned projecting portions 1i and the projections 1f are formed over the back surface of the tray 1, which the main surface of the semiconductor chip 2 faces in an opposed manner, the above-mentioned distance Za can be set as the distance from the main surface of the semiconductor chip 2 to the distal end of the projection 1f in order to ensure that the distance Za is provided. Accordingly, the height of the projecting columns 1g can be increased by an amount corresponding to a sum of the respective heights of the projecting portion 1i and the projection 1f in the direction of the arrow indicated by a broken line in FIG. 45. Accordingly, as shown in FIG. 46, it is possible to set the height of the projecting columns 1g, which are formed over the main surface of the tray 1 higher than the height of the projecting columns 1g in the case shown in FIG. 44; and, at the same time, it is possible to maintain the distance Za, which is equal to the distance Za in the above-mentioned FIG. 44, at the time of transporting the semiconductor chips 2. In this case, since it is possible to increase the height of the projecting columns 1g, that is, the depth of the accommodating portions 1c1, at the time of takeout/accommodating of the semiconductor chips 2, it is possible to further decrease the influence to which other semiconductor chips 2 that are already accommodated in the tray 1 are subjected. Further, since the distance Za can be maintained at the time of transporting the semiconductor chips 2, it is possible to suppress the vertical movement and rotational operation of the semiconductor chips 2 during the transportation thereof. Accordingly, it is possible to reduce or prevent flaws in and chipping of the semiconductor chips 2 attributed to vertical movement and rotational movement of the semiconductor chips 2 during the transportation thereof. Further, the drawback that portions of the trays 1 will be abraded or shaved due to vertical movement of the semiconductor chips 2 or the like and that, foreign substances will be generated thereby can also be suppressed or prevented.

Next, one example of a method of accommodating semiconductor chips 2 into the tray 1 according to this embodiment 3 will be explained. Here, the general disadvantages of the transport method and manufacturing method of this embodiment 3 are the same as the disadvantages of the above-mentioned embodiment 1, and, hence, a repeated explanation thereof is omitted. In the same manner as explained in conjunction with FIG. 14 to FIG. 18 and the like in connection with the above-mentioned embodiment 1, FIG. 47 and FIG. 48 are cross-sectional views of part of the tray 1 showing a step for accommodating a plurality of respective semiconductor chips 2, that have been divided from the wafer 2W (see FIG. 14), in the accommodating portions 1c1 formed over the main surface side of the tray 1, after they have been subjected to a wafer process (pre-step), a thickness reduction treatment step and a dicing treatment step.

Figure 47:
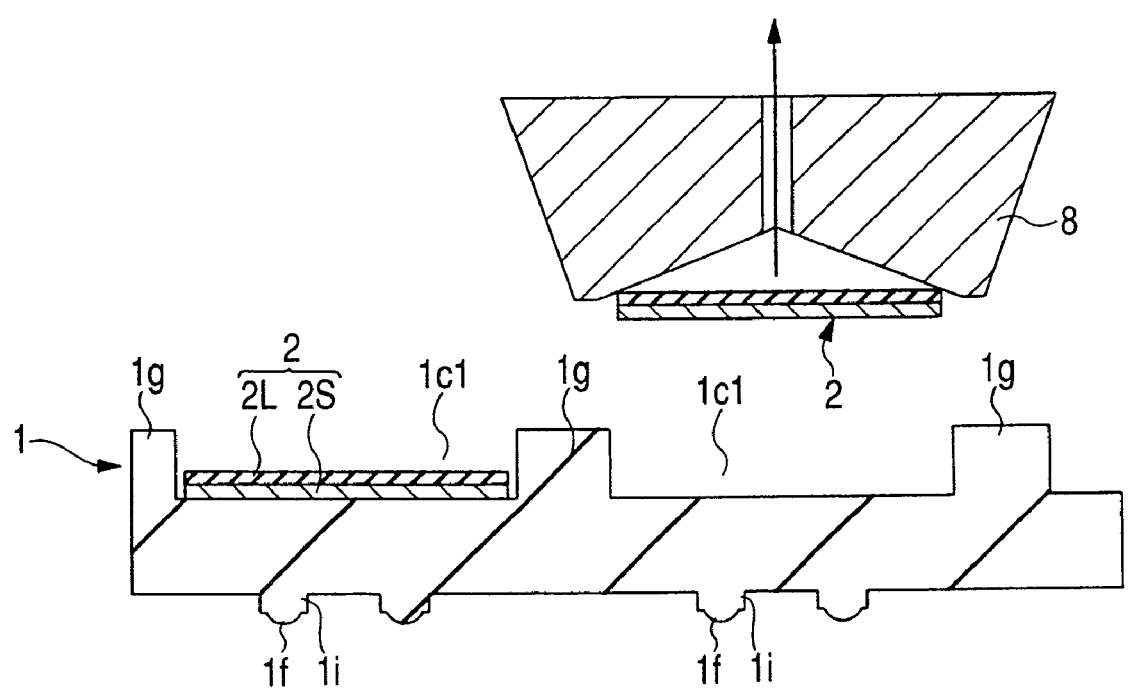
FIG. 47 is a cross-sectional view of tray showing a step in which the semiconductor chips are accommodated in accommodating portions on the main surface side of the tray used in the transport of a semiconductor device, which constitutes one embodiment of the present invention.
Figure 48:
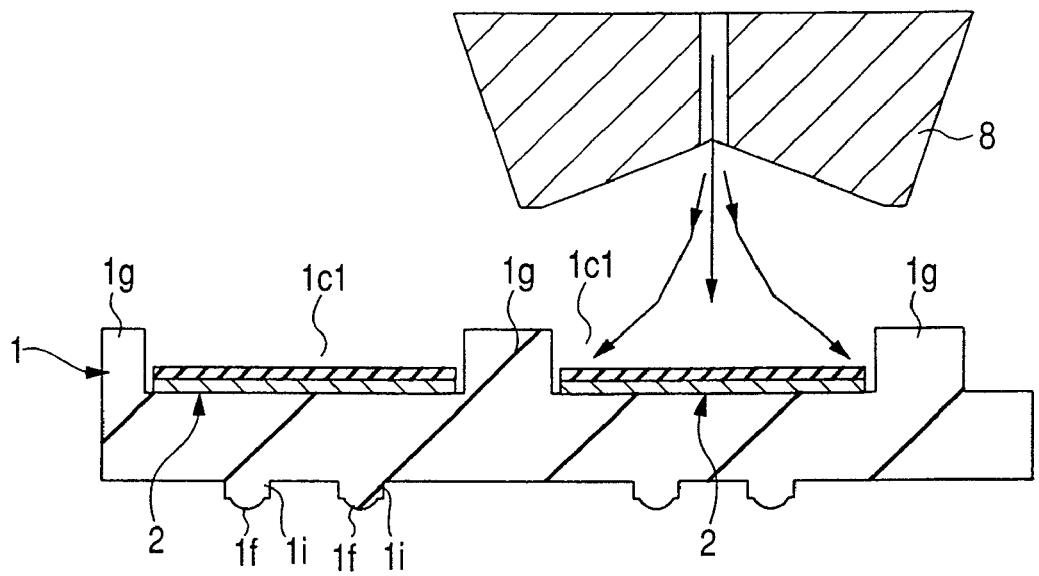
FIG. 48 is a cross-sectional view of a tray in an accommodation step in the manufacture of semiconductor chips which follows the step shown in FIG. 47.

First of all, as shown in FIG. 47, the semiconductor chip 2 is transported to a position above the desired accommodating portion 1c1 of the tray 1 in a state in which the semiconductor chip 2 is sucked by vacuum using a collet (vacuum suction means) 8. Here, the semiconductor chip 2 is positioned such that the main surface of the semiconductor chip 2 is made to face a vacuum suction surface of the collet 8. Subsequently, the vacuum suction state of the collet 8 is released. When the thickness of the semiconductor chip 2 is reduced as described above to approximately 100 µm, the semiconductor chip 2 becomes more light-weight, and due to the adhesive strength of a polyimide-based resin film formed over the main surface side of the semiconductor chip 2, there may be a case in which the semiconductor chip 2 can not be separated from the collet 8 merely by releasing the vacuum suction state. Accordingly, also in this embodiment 3, air is lightly and reversely injected from the collet 8 against the semiconductor chip 2 at the same time chip 2 is to be released. As a result, the semiconductor chip 2 is separated and is made to fall from the collet 8 and is accommodated in the desired accommodating portion 1c1. At this point of time, since the depth of the accommodating portion 1c1 is sufficiently ensured, as described above in connection with this embodiment 3, even when the thickness of the semiconductor chip 2 is reduced, and, hence, the semiconductor chip 2 becomes more light-weight, there is no possibility that other semiconductor chips 2 which are already stored in other accommodating portions 1c1 of the tray 1 will be expelled to the outside of the accommodating portion 1c1.

Figure 49:
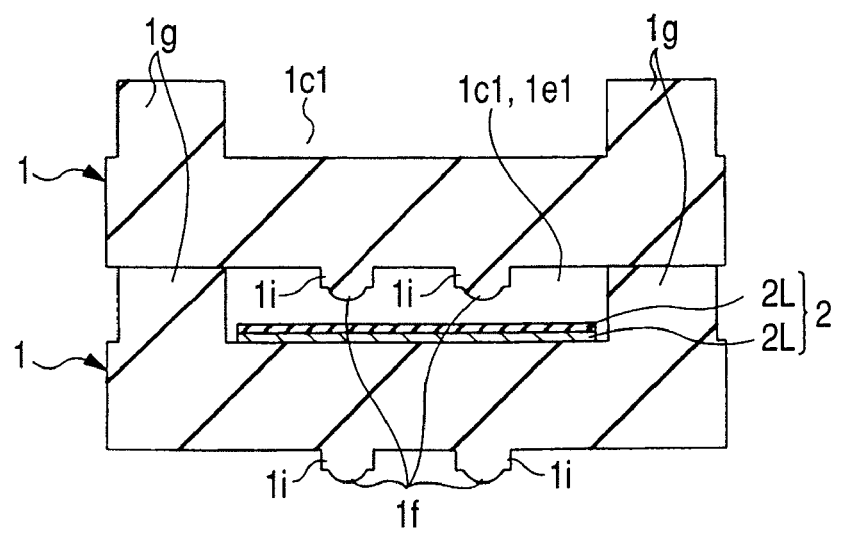
FIG. 49 is a cross-sectional view of a tray in a back surface inspection step in the manufacture of semiconductor chips.
Figure 50:
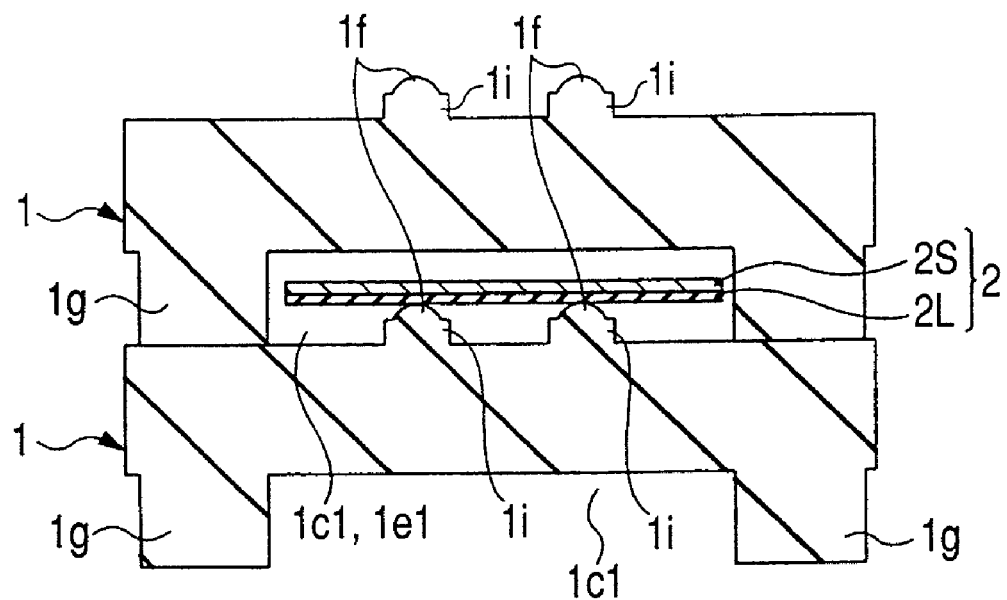
FIG. 50 is a cross-sectional view of a tray in the back surface inspection step in the manufacture of semiconductor chips which follows the step shown in FIG. 49.
Figure 51:
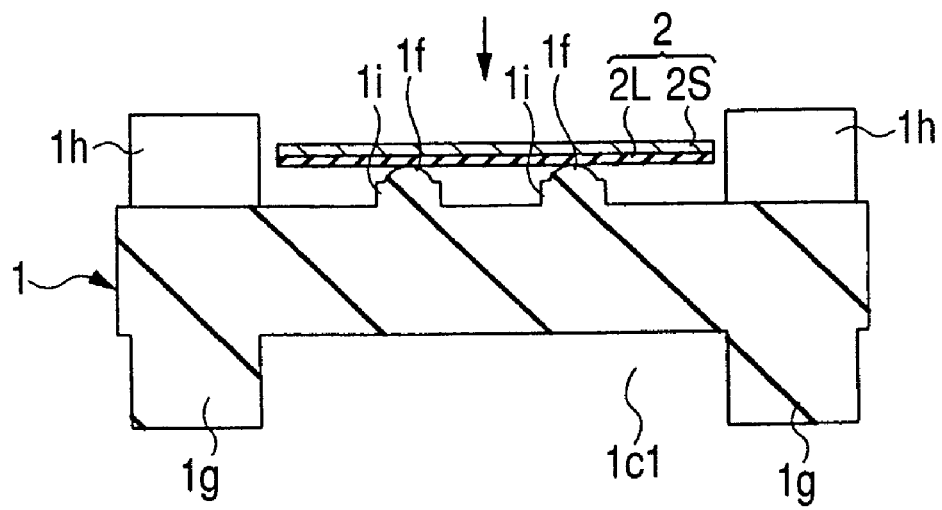
FIG. 51 is a cross-sectional view of a tray in the back surface inspection step in the manufacture of semiconductor chips which follows the step shown in FIG. 50.

Next, one example of a method of inspecting the state of the back surface of the semiconductor chip 2 during the transportation of the semiconductor chips 2 will be explained. FIG. 49 to FIG. 51 are cross-sectional views of part of the tray 1 as it appears in the back surface inspection of the semiconductor chip 2. First of all, FIG. 49 shows a state in which the semiconductor chip 2 is accommodated on the main surface side of a lower tray 1 and another upper tray 1 is stacked on the lower tray. In the back surface inspection of the semiconductor chip 2, the stack of trays 1 which accommodate the semiconductor chip 2 is turned up-side-down, as shown in FIG. 50. As a result, the semiconductor chip 2 is supported in a floating state such that the main surface thereof is brought into point contact with the projections 1f formed over the back surface of the upper tray 1. Subsequently, in such a state, as shown in FIG. 51, the now upper-side tray 1 is removed. At this point of time, the semiconductor chip 2 is accommodated in the accommodating portion 1e1 formed by the projecting walls 1h formed over the back surface side of what was previously the upper tray and, at the same time, is supported on a plurality of projections 1f. Then, the back surface of the semiconductor chip 2 is inspected from the direction indicated by the arrow in FIG. 51. After completion inspection of the back surface inspection of the semiconductor chip 2, the covering tray 1 is replaced and the stack is again turned up-side-down to return the stack to the original state shown in FIG. 49. At this point of time, also in this embodiment 3, in the same manner as the above-mentioned embodiment 1, with the provision of the projections 1f on the back surface of the tray 1, it is possible to prevent the semiconductor chips 2 from adhering to the back surface of the tray 1.

Embodiment 4

Figure 52:
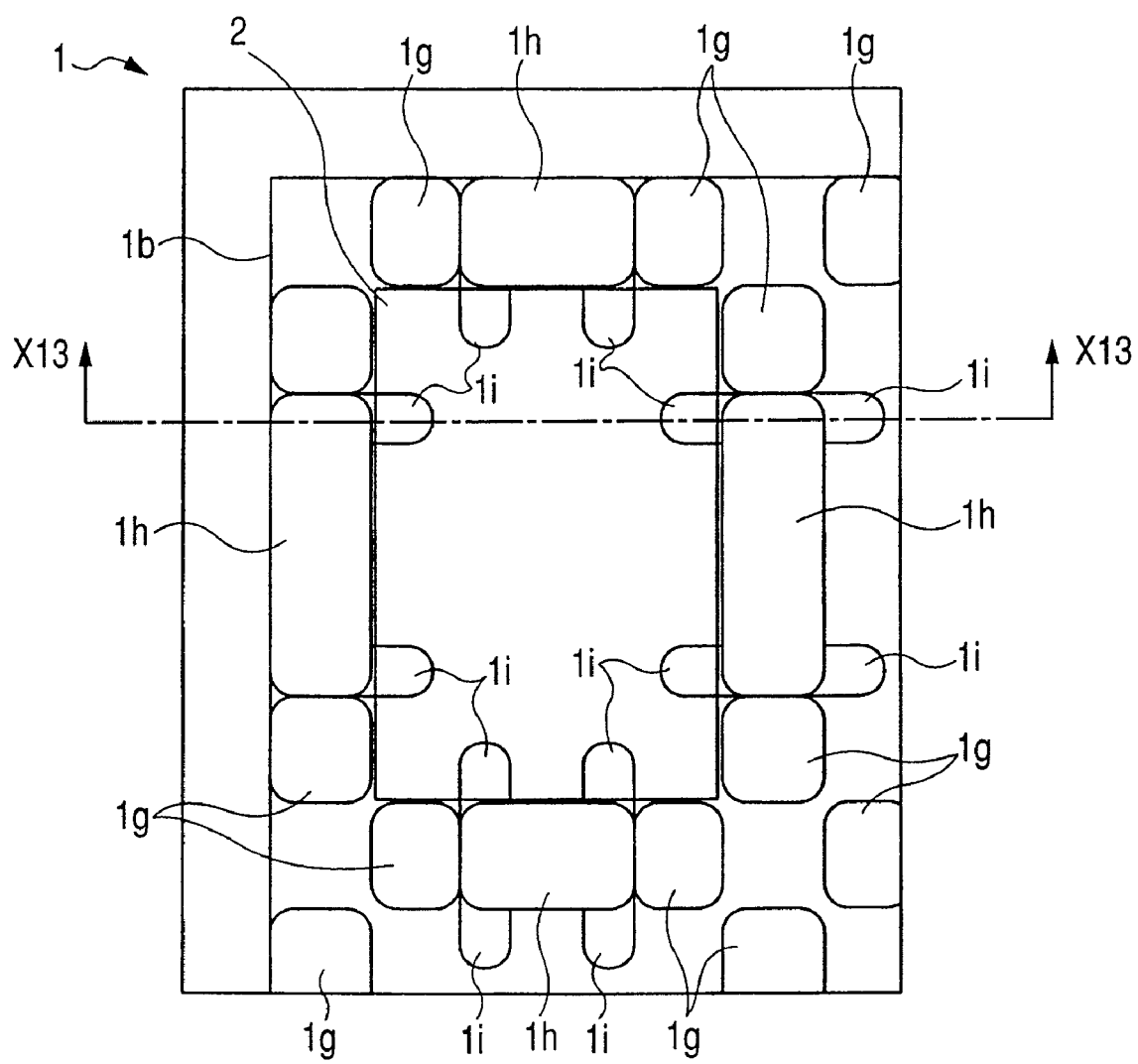
FIG. 52 is a plan view showing part of the tray used in the transport of a semiconductor device which constitutes another embodiment of the present invention.
Figure 53:
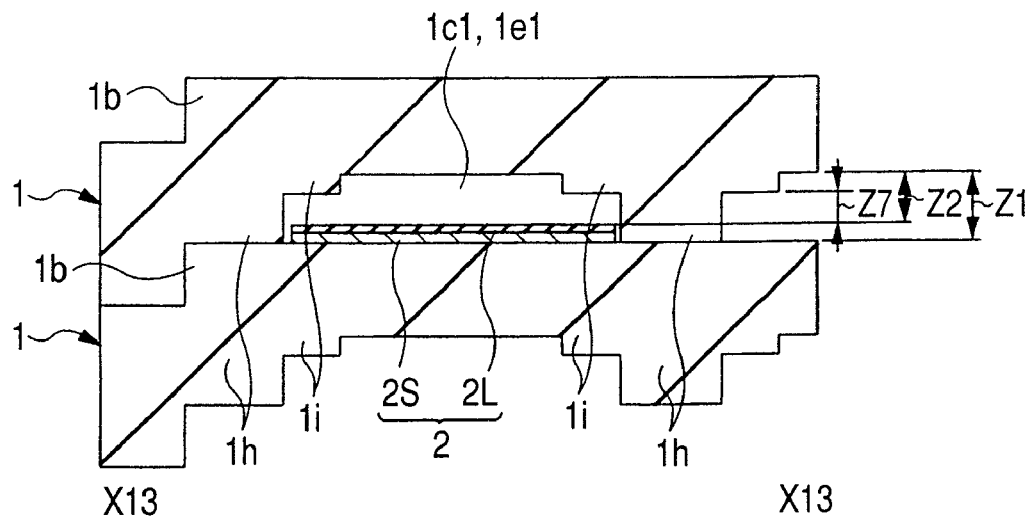
FIG. 53 is a cross-sectional view taken along a line X13-X13 in FIG. 52.

FIG. 52 is a plan view of part of the main surface of the tray 1 when the trays 1 of this embodiment 4 are stacked in a plurality of stages, and FIG. 53 is a cross-sectional view taken along a line X13-X13 in FIG. 52. Here, in FIG. 52, the state of the inside of the tray 1 is shown in a see-through manner to illustrate the state of the inside of the tray 1.

In this embodiment 4, there are no projections 1f of the type provided by embodiment 3 on the back surface of the tray 1. Other structural features of this embodiment 4 are the same as the corresponding structural features of the above-mentioned embodiment 3. In this embodiment 4, the projecting portions 1i perform substantially the same role as the projections 1f. The distance Z7 indicates a distance from the main surface of the semiconductor chip 2 to the surface of the projecting portion 1I which faces the main surface of the semiconductor chip 2. The distance Z7 is not specifically limited and is approximately 0.32 mm, for example.

Embodiment 5

Figure 54:
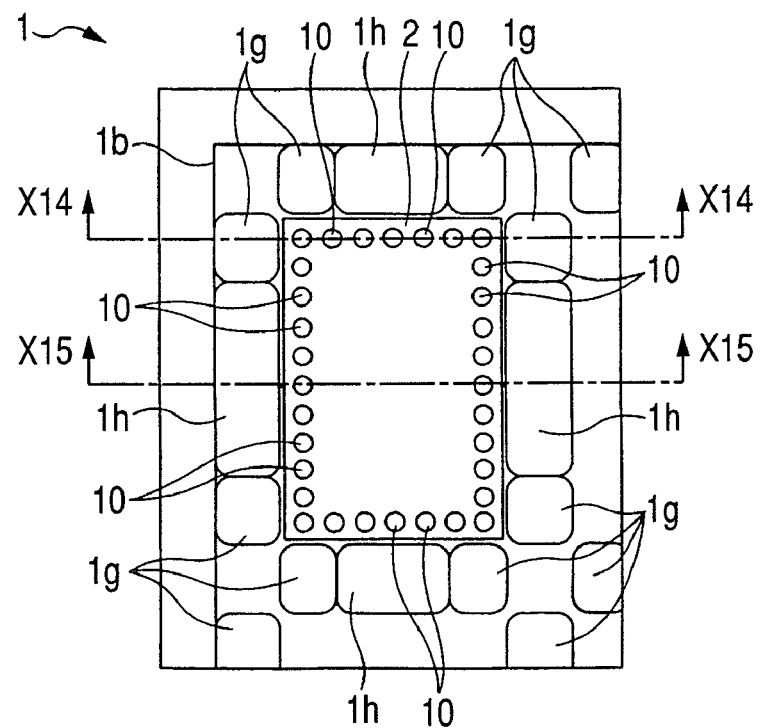
FIG. 54 is a plan view showing part of the tray used in the transport of a semiconductor device which constitutes another embodiment of the present invention.
Figure 55:
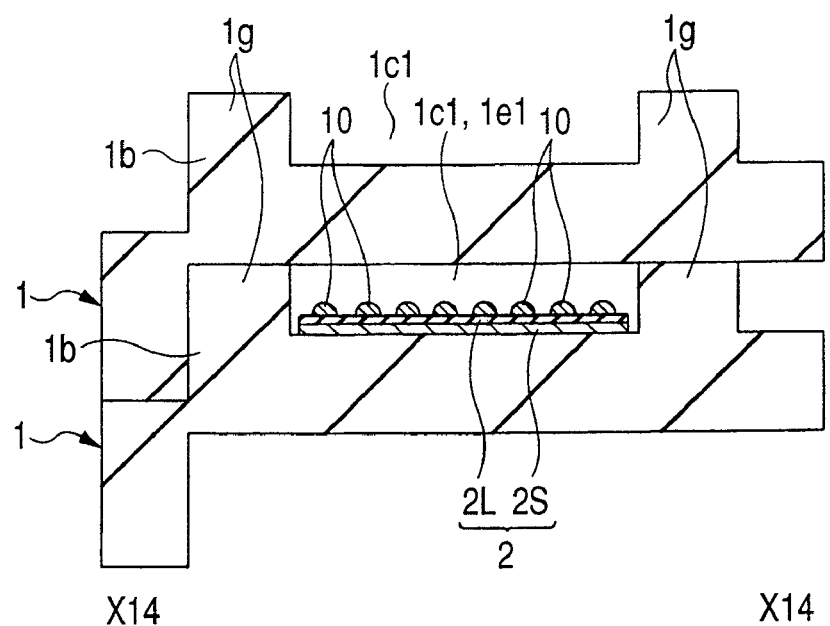
FIG. 55 is a cross-sectional view taken along a line X14-X14 in FIG. 54.
Figure 56:
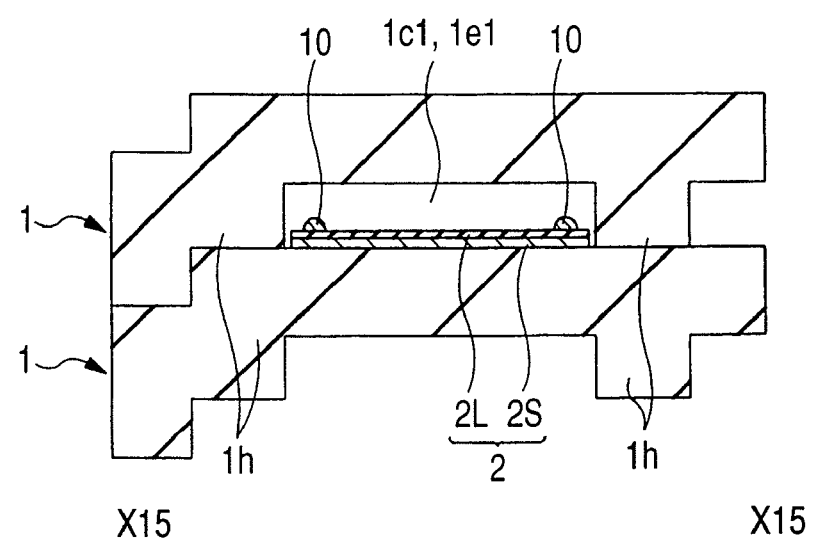
FIG. 56 is a cross-sectional view taken along a line X15-X15 in FIG. 54.

In this embodiment 5, a case in which bump electrodes are formed over the main surface of the semiconductor chip will be explained. FIG. 54 is a plan view of part of the main surface of the tray 1 when the trays 1 are stacked in a plurality of stages in this embodiment 5, while FIG. 55 and FIG. 56 are, respectively, cross-sectional views taken along a line X14-X14 and a line X15-X15 in FIG. 53. Here, also in FIG. 54, the state of the inside of the tray 1 is shown in a see-through manner such that the state of the inside of the tray 1 can be illustrated.

A plurality of bump electrodes 10 are formed over the main surface of the semiconductor chip 2 along an outer periphery thereof. The bump electrodes 10 are electrically connected with the above-mentioned bonding pads 2BP (see FIG. 9 and the like). The structural features of the semiconductor chip 2 other than the above-mentioned constitution is equal to the corresponding constitution of the above-mentioned embodiments 1 to 4. In FIG. 54 to FIG. 56, the semiconductor chips 2 are accommodated in a state in which the back surface thereof is brought into contact with the main surface of the tray 1 and, at the same time, in a state such that the surface on which the bump electrodes 10 are formed over the main surface of the semiconductor chip 2 is arranged to face the back surface of the upper-stage tray 1. Although the constitution of the main surface of the tray 1 is the corresponding constitution of the above-mentioned embodiments 3, 4, the constitution of the back surface of the tray 1 slightly differs from the corresponding constitution of the back surface of the above-mentioned embodiments 3, 4. That is, on the back surface of the tray 1, although the projecting walls 1h are formed in the same manner as the above-mentioned embodiment, 3, 4, the above-mentioned projecting portions 1i and the projections 1f are not formed on the tray. This is because, in this embodiment 5, the bump electrodes 10 that are formed over the main surface of the semiconductor chip 2 perform the same role as the above-mentioned projecting portions 1i and the projections 1f.

Embodiment 6

Figure 57:
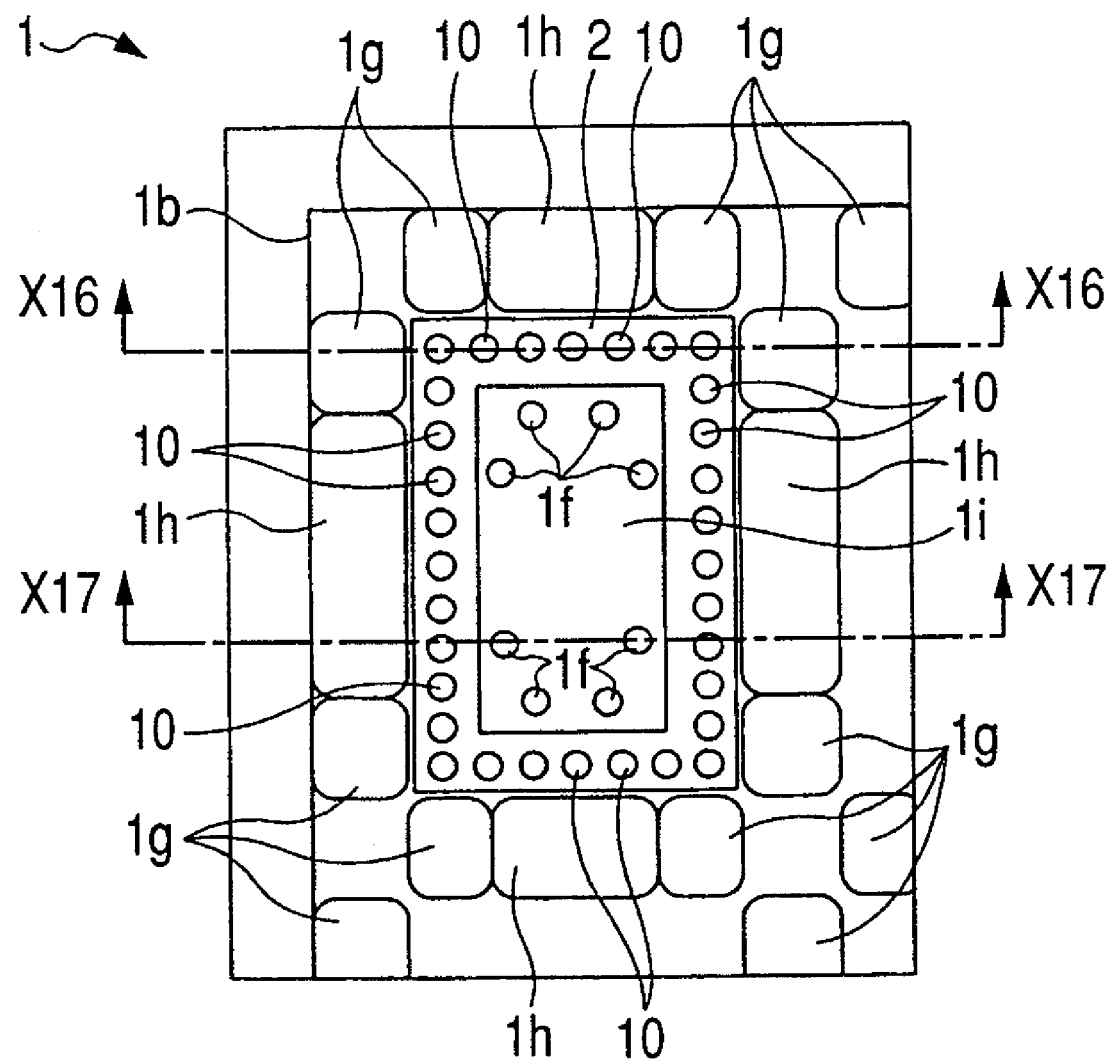
FIG. 57 is a plan view showing part of the tray used in the transport of a semiconductor device which constitutes another embodiment of the present invention.
Figure 58:
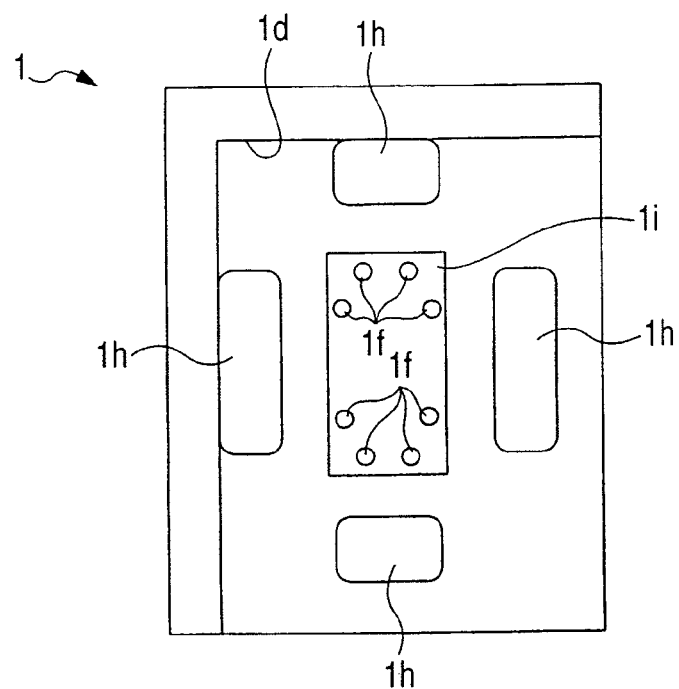
FIG. 58 is a plan view of part of the back surface of the tray shown in FIG. 57.
Figure 59:
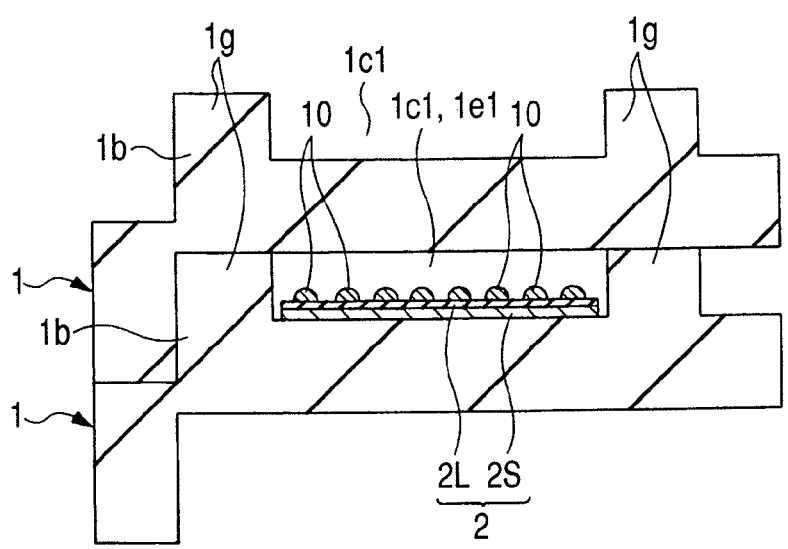
FIG. 59 is a cross-sectional view taken along a line X16-X16 in FIG. 57.
Figure 60:
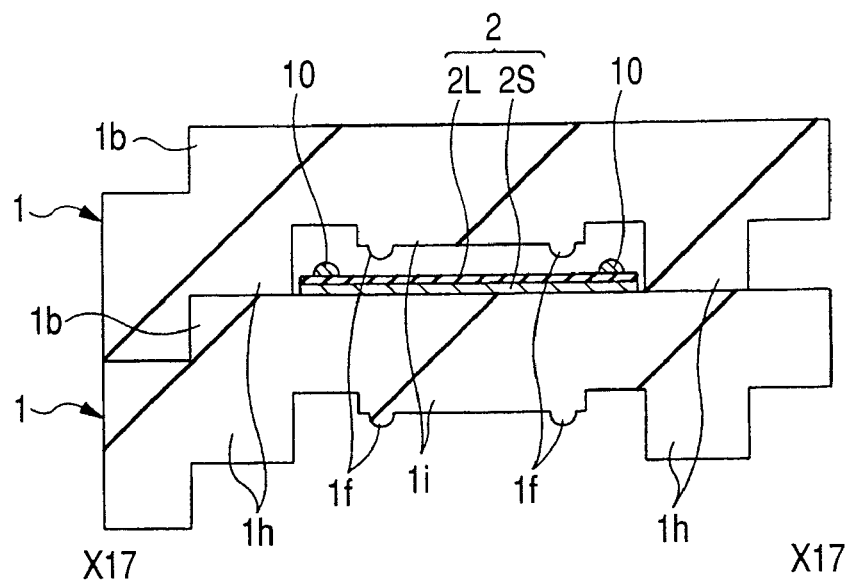
FIG. 60 is a cross-sectional view taken along a line X17-X17 in FIG. 57.

In the embodiment 6, another case in which bump electrodes are formed over the main surface of the semiconductor chip will be explained. FIG. 57 is a plan view showing part of the tray 1 of this embodiment 6 when the trays 1 are stacked in a plurality of stages; FIG. 58 is a plan view showing the back surface of the tray 1 shown in FIG. 57, and FIG. 59 and FIG. 60 are cross-sectional views taken along a line X16-X16 and a line X17-X17 in FIG. 57, respectively. Here, also in FIG. 57, the state of the inside of the tray 1 is shown in a see-through manner so that the state of the inside of the tray 1 can be illustrated.

The constitution of the semiconductor chip 2 is substantially the same as the corresponding constitution of the semiconductor chip 2 of the above-mentioned embodiment 5. On the center portion of the back surface of the tray 1, which faces the main surface of the semiconductor chip 2 on which the bump electrodes 10 are formed, the projecting portions 1i are formed. In this embodiment 6, the planar area of the projecting portion 1i is formed to be larger than the planar area of the projecting portion 1i in the above-mentioned embodiment 3. On the upper surface of the projecting portions 1i, a plurality of projections 1f are formed in a scattered manner with an up-and-down and left-and-right symmetry.

Figure 61:
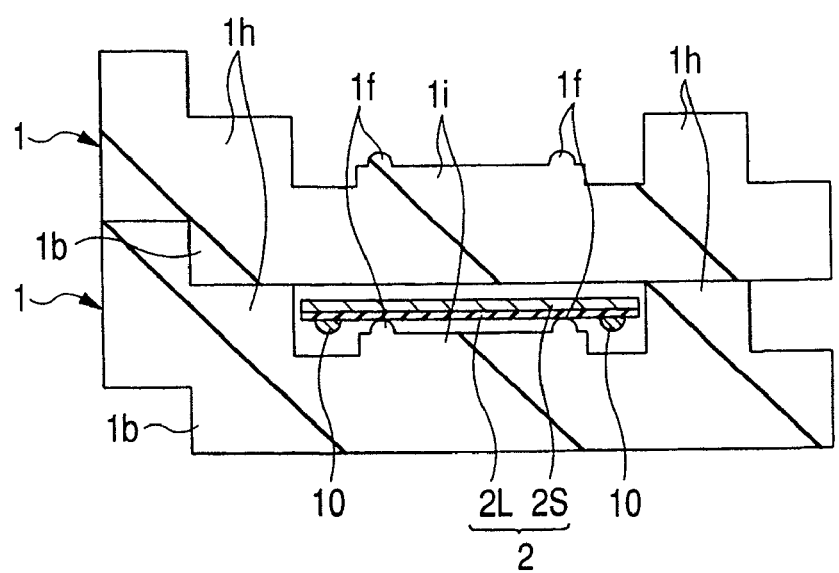
FIG. 61 is a cross-sectional view of part of the tray showing in a state in which the stack of trays of FIG. 60 is turned up-side-down.

FIG. 61 is a cross sectional view taken along a line X17-X17 shown the tray 1 FIG. 57 turned up-side-down. The semiconductor chip 2 is supported in a floating state such that a polyimide-based resin film on the main surface thereof is brought into point contact with a plurality of the projections 1f. By removing the upper-stage tray 1 in this state, it is possible to perform an inspection of the back surface of the semiconductor chip 2 in the same manner as in the above-mentioned embodiment 3. Also, in this embodiment 6, the contact area between the tray 1 and the resin film of semiconductor chip 2 is decreased, and, hence, when the tray 1 is returned to the original state by turning the tray 1 over again, in the same manner as the above-mentioned embodiment 1, it is possible to prevent the semiconductor chip 2 from adhering to the back surface of the tray 1. Further, in this embodiment 6, the projections 1f and the projecting portions 1i are formed such that these components are not brought into contact with the bump electrodes 10 of the semiconductor chip 2. The semiconductor chip 2 is constituted such that portions thereof, other than the projecting portions 1i and the projections 1f formed over the tray 1, are not brought into contact with the bump electrodes 10. Due to such a constitution, it is possible to obviate the drawback that the bump electrodes 10 of the semiconductor chip 2 are peeled off when hitting an inner wall of the tray 1.

Although the present invention has been specifically explained in conjunction with the embodiments, it is needless to say that the present invention is not limited to the above-mentioned embodiments and various modifications can be made without departing from the gist of the present invention.

For example, an explanation has been made with respect to a case in which the semiconductor chip and the printed circuit board are connected by way of bonding wires in the embodiments 1 to 4, the present invention is not limited to such a case and is applicable to a case in which the semiconductor chip and the printed circuit board are connected using bump electrodes, for example. In the manufacture of the semiconductor device in such a case, first of all, on the main surface of the wafer 2W which was considered in conjunction with FIG. 14, a bump background metal pattern which is connected with the bonding pads 2BP is formed. Thereafter, the semiconductor chips 2, which are obtained through the steps shown in FIG. 16 and FIG. 17, are accommodated in the tray 1 and are transported. At the transport destination, bump electrodes are formed over the bump background metal pattern of the semiconductor chip 2, and, thereafter, the semiconductor chip 2 is electrically connected with the printed circuit board 4 through the bump electrodes. Then, by making the semiconductor chip 2 pass through the usual sealing step, the semiconductor device is manufactured.

Further, the present invention is also applicable to the transfer of the CSP manufactured through the WPP ("Wafer Process Package" step). In the manufacture of the semiconductor device in this case, first of all, a rewiring layer is formed over the main surface of the wafer 2W which was described in conjunction with FIG. 14. In the rewiring layer, relines which are connected with the bonding pads 2BP and an insulation film which covers the relines are formed. The relines are made of copper (Cu), for example, and the insulation film which covers the relines is made of a polyimide resin, for example. Subsequently, an opening portion, which exposes portions of the relines, are formed in the insulation film made of polyimide resin and, thereafter, a bump background metal pattern which is connected with the relines through the opening portions is formed. Thereafter, the CSPs, which are obtained through the steps shown in FIG. 16 and FIG. 17, are accommodated in the tray 1 and are transported. At the transport destination, bump electrodes are formed over the bump background metal pattern of the CSP, and, thereafter, the CSP is electrically connected with a printed circuit board through the bump electrodes. Then, by making the CSP pass through the usual sealing step, the semiconductor device is manufactured.

Further, the provision of projections 1f is not limited to the case in which the projections 1f are individually separated, and the projections 1f may be constituted such that the projections 1f are connected in a planar frame shape or a planar rod shape. Also, in these cases, the projections are formed to prevent the semiconductor chips from becoming inclined when the semiconductor chips 2 are mounted on the bottom surfaces of the accommodating portions 1e formed over the back surface of the tray 1.

Further, in the above-mentioned embodiments 1 to 6, an explanation has been made with respect to a case in which the tray includes a hydrophilic polymer or carbon as a protective measure against electrostatic breakdown. However, since the semiconductor-chip adhering phenomenon is liable to easily occur due to charging of static electricity when the electrostatic countermeasure is not provided to the tray, it is particularly preferable to apply this technique.

In the above-mentioned description, an explanation has been mainly made with respect to a case in which the present invention is applied to the manufacture of a semiconductor device, which is a technical field which constitutes the background of the present invention. However, the application of the present invention is not limited to such a case and various modifications can be considered. For example, the present invention is applicable to a transport method and a method of manufacture of micromachines, for example.

The present invention is applicable to the transport industry and the semiconductor device manufacturing industry.

What is claimed is:

1. A method of manufacturing a semiconductor device, comprising steps of:
   (a) forming an element and a wiring layer on a main surface of a semiconductor wafer;
   (b) reducing a thickness of the semiconductor wafer;
   (c) cutting out semiconductor chips from the semiconductor wafer; and
   (d) transporting the semiconductor chips in a state that the semiconductor chips are accommodated in a tray,
   wherein the step (d) includes the steps of:
   (d1) providing a plurality of trays each having a first accommodating portion formed on a main surface thereof and a second accommodating portion formed on a back surface thereof, the back surface thereof opposing to the main surface thereof; and
   (d2) transporting the plurality of trays to a desired place in a state that the semiconductor chips formed in the step (c) are accommodated in a space, wherein the space is defined at portions where the second accommodating portion of the back surface of an upper-stage tray of the plurality of trays overlaps the first accommodating portion of the main surface of a lower-stage tray of the plurality of trays, when the plurality of trays are stacked in a plurality of stages;
   wherein a projection is formed on a bottom surface in the second accommodating portion, the bottom surface opposing to the semiconductor chip;
   wherein the projection is not in contact with the semiconductor chip accommodated in the tray;
   wherein the semiconductor chip is accommodated such that a main surface of the semiconductor chip opposes to the bottom surface of the second accommodating portion;
   wherein a polyimide-based resin film is exposed on the main surface of the semiconductor chip; and
   wherein an external terminal formed on the main surface of the semiconductor chip is exposed from an opening formed in the resin film.

2. The method of manufacturing a semiconductor device according to claim 1, wherein a height of the projection is equal to or more than 100 µm.

3. The method of manufacturing a semiconductor device according to claim 1, wherein a thickness of the semiconductor chip is equal to or less than 150 µm.

4. A method of manufacturing a semiconductor device, comprising steps of:
   (a) forming an element and a wiring layer on a main surface of a semiconductor wafer;
   (b) reducing a thickness of the semiconductor wafer;
   (c) cutting out semiconductor chips from the semiconductor wafer; and
   (d) transporting the semiconductor chips in a state that the semiconductor chips are accommodated in a tray,
   wherein the step (d) includes the steps of:
   (d1) providing a plurality of trays each having a first accommodating portion formed on a main surface thereof and a second accommodating portion formed on a back surface thereof, the back surface thereof opposing to the main surface thereof; and
   (d2) transporting the plurality of trays to a desired place in a state that the semiconductor chips formed in the step (c) are accommodated in a space, wherein the space is defined at portions where the second accommodating portion of the back surface of an upper-stage tray of the plurality of trays overlaps the first accommodating portion of the main surface of a lower-stage tray of the plurality of trays, when the plurality of trays are stacked in a plurality of stages;
   wherein a convexoconcave shape is formed on a bottom surface in the first accommodating portion by pearskin finish treatment;
   wherein a projection is formed on a bottom surface in the second accommodating portion, the bottom surface in the second accommodating portion opposing to the semiconductor chip;
   wherein the projection is not in contact with the semiconductor chip accommodated in the tray;
   wherein the projection is formed such that a roughness of the bottom surface in the second accommodating portion is greater than that of the bottom surface in the first accommodating portion;
   wherein the semiconductor chip is accommodated such that a main surface of the semiconductor chip opposes to the bottom surface of the second accommodating portion;
   wherein a polyimide-based resin film is exposed on the main surface of the semiconductor chip; and wherein an external terminal formed on the main surface of the semiconductor chip is exposed from an opening formed in the resin film.

5. The method of manufacturing a semiconductor device according to claim 4, wherein a height of the projection is equal to or more than 100 µm.

6. The method of manufacturing a semiconductor device according to claim 4, wherein a thickness of the semiconductor chip is equal to or less than 150 µm.

7. A method of manufacturing a semiconductor device, comprising steps of:
(a) forming an element and a wiring layer on a main surface of a semiconductor wafer;
(b) reducing a thickness of the semiconductor wafer;
(c) cutting out semiconductor chips from the semiconductor wafer; and
(d) transporting the semiconductor chips in a state that the semiconductor chips are accommodated in a tray,
wherein the step (d) includes the steps of:
(d1) providing a plurality of trays each having a first accommodating portion formed on a main surface thereof and a second accommodating portion formed on a back surface thereof, the back surface thereof opposing to the main surface thereof; and
(d2) transporting the plurality of trays to a desired place in a state that the semiconductor chips formed in the step (c) are accommodated in a space, wherein the space is defined at portions where the second accommodating portion of the back surface of an upper-stage tray of the plurality of trays overlaps the first accommodating portion of the main surface of a lower-stage tray of the plurality of trays, when the plurality of trays are stacked in a plurality of stages;
wherein a plurality of projections are formed on a bottom surface in the second accommodating portion, the bottom surface in the second accommodating portion opposing to the semiconductor chip;
wherein the plurality of projections are decentrally-arranged on the bottom surface;
wherein each of the plurality of projections is not in contact with the semiconductor chip accommodated in the tray;
wherein the semiconductor chip is accommodated such that a main surface of the semiconductor chip opposes to the bottom surface of the second accommodating portion;
wherein a polyimide-based resin film is exposed on the main surface of the semiconductor chip; and
wherein an external terminal formed on the main surface of the semiconductor chip is exposed from an opening formed in the resin film.

8. The method of manufacturing a semiconductor device according to claim 7, wherein a height of the projection is equal to or more than 100 µm.

9. The method of manufacturing a semiconductor device according to claim 7, wherein a thickness of the semiconductor chip is equal to or less than 150 µm.

10. A method of manufacturing a semiconductor device, comprising steps of:
(a) forming an element and a wiring layer on a main surface of a semiconductor wafer;
(b) reducing a thickness of the semiconductor wafer;
(c) cutting out semiconductor chips from the semiconductor wafer; and
(d) transporting the semiconductor chips in a state that the semiconductor chips are accommodated in a tray,
wherein the step (d) includes the steps of:
(d1) providing a plurality of trays each having a first accommodating portion formed on a main surface thereof and a second accommodating portion formed on a back surface thereof, the back surface thereof opposing to the main surface thereof; and
(d2) transporting the plurality of trays to a desired place in a state that the semiconductor chips formed in the step (c) are accommodated in a space, wherein the space is defined at portions where the second accommodating portion of the back surface of an upper-stage tray of the plurality of trays overlaps the first accommodating portion of the main surface of a lower-stage tray of the plurality of trays, when the plurality of trays are stacked in a plurality of stages;
wherein a convexoconcave shape is formed on a bottom surface in the first accommodating portion by pearskin finish treatment;
wherein a plurality of projections are decentrally-arranged on a bottom surface in the second accommodating portion, the bottom surface in the second accommodating portion opposing to the semiconductor chip;
wherein a height of each of the plurality of projections is larger than that of a convex portion of the convexoconcave shape;
wherein each of the plurality of projections is not in contact with the semiconductor chip accommodated in the tray;
wherein the semiconductor chip is accommodated such that a main surface of the semiconductor chip opposes to the bottom surface of the second accommodating portion;
wherein a polyimide-based resin film is exposed on the main surface of the semiconductor chip; and
wherein an external terminal formed on the main surface of the semiconductor chip is exposed from an opening formed in the resin film.

11. The method of manufacturing a semiconductor device according to claim 10, wherein a height of the projection is equal to or more than 100 µm.

12. The method of manufacturing a semiconductor device according to claim 10, wherein a thickness of the semiconductor chip is equal to or less than 150 µm.

13. A method of manufacturing a semiconductor device, comprising steps of:
(a) forming an element and a wiring layer on a main surface of a semiconductor wafer;
(b) reducing a thickness of the semiconductor wafer;
(c) cutting out semiconductor chips from the semiconductor wafer;
(d) transporting the semiconductor chips in a state that the semiconductor chips are accommodated in a tray;
(e) after the step (d), picking up the semiconductor chip from the tray, and mounting the semiconductor chip on a chip-mounting area of a substrate; and
(f) after the step (e), electrically connecting an external terminal with an electrode of the substrate, wherein the external terminal is a part of the wiring layer formed on the main surface of the semiconductor chip,
wherein the step (d) includes the steps of:
(d1) providing a plurality of trays each having a main surface, a first accommodating portion formed on the main surface, and a back surface opposing to the main surface; and
(d2) transporting the plurality of trays to a desired place in a state that the semiconductor chips formed in the step (c) are accommodated in a space, wherein the space is defined at portions where the back surface of the upper-stage tray of the plurality of trays overlaps the first accommodating portion of the main surface of the lower-stage tray of the plurality of trays, when the plurality of trays are stacked in a plurality of stages;

wherein a projection is formed on a bottom surface in a second accommodating portion, the bottom surface opposing to the semiconductor chip;

wherein the projection is not in contact with the semiconductor chip accommodated in the tray;

wherein the semiconductor chip is accommodated such that a main surface of the semiconductor chip opposes to the bottom surface of the second accommodating portion;

wherein a polyimide-based resin film is exposed on the main surface of the semiconductor chip; and wherein an external terminal formed on the main surface of the semiconductor chip is exposed from an opening formed in the resin film.

14. The method of manufacturing a semiconductor device according to claim 13, wherein a height of the projection is equal to or more than 100 µm.

15. The method of manufacturing a semiconductor device according to claim 13, wherein a thickness of the semiconductor chip is equal to or less than 150 µm.

* * * * *